(12) United States Patent
Murata

(10) Patent No.: US 8,441,851 B2
(45) Date of Patent: May 14, 2013

(54) SEMICONDUCTOR STORAGE CIRCUIT

(75) Inventor: Nobukazu Murata, Tokyo (JP)

(73) Assignee: Lapis Semiconductor Co., Ltd. (JP)

( * ) Notice: Subject to any disclaimer, the term of this patent is extended or adjusted under 35 U.S.C. 154(b) by 184 days.

(21) Appl. No.: 13/033,181

(22) Filed: Feb. 23, 2011

(65) Prior Publication Data

US 2011/0205776 A1    Aug. 25, 2011

(30) Foreign Application Priority Data

Feb. 24, 2010  (JP) .................................. 2010-039210

(51) Int. Cl.
*G11C 11/34*   (2006.01)

(52) U.S. Cl.
USPC ............ 365/185.03; 365/185.17; 365/185.13; 365/196; 365/205; 365/207

(58) Field of Classification Search ............. 365/185.03, 365/185.17, 185.13, 196, 205, 207
See application file for complete search history.

(56) References Cited

U.S. PATENT DOCUMENTS

2008/0291725 A1* 11/2008 Terasawa et al. ........ 365/185.05
2011/0035644 A1*  2/2011 Madan ......................... 714/758

FOREIGN PATENT DOCUMENTS

JP   2006-309811 A   11/2006

* cited by examiner

*Primary Examiner* — Richard Elms
*Assistant Examiner* — Han Yang
(74) *Attorney, Agent, or Firm* — Rabin & Berdo, P.C.

(57) ABSTRACT

The present invention provides a semiconductor storage circuit that may suppress a data read characteristic from being deteriorated due to influence of characteristic change of a sense amplifier, in a multi-bit-type memory cell. The semiconductor storage circuit includes a memory cell array that has plural multi-bit-type memory cells, two multiplexers, and two sense amplifiers. The first multiplexer connects a main bit line connected to an R-side electrode of the even-numbered memory cell in a row direction to the first sense amplifier, and connects a main bit line connected to an L-side electrode of the odd-numbered memory cell to the second sense amplifier. The second multiplexer connects a main bit line connected to an L-side electrode of the even-numbered memory cell to the first sense amplifier, and connects a main bit line connected to an R-side electrode of the odd-numbered memory cell to the second sense amplifier.

8 Claims, 27 Drawing Sheets

FIG. 25A
RELATED ART

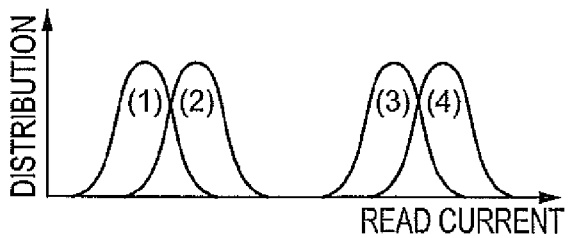
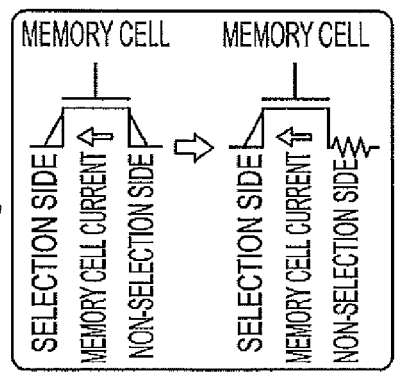

(1),(2): DISTRIBUTION OF MEMORY CELL CURRENT VALUE OF LOGICAL LEVEL "0"
  (1): NON-SELECTION SIDE ALSO HAS LOGICAL LEVEL "0" ⇒ RESISTANCE OF
       NON-SELECTION SIDE IS LARGE
  (2): NON-SELECTION SIDE HAS LOGICAL LEVEL "1" ⇒ RESISTANCE OF
       NON-SELECTION SIDE IS SMALL (3),(4): DISTRIBUTION OF MEMORY CELL CURRENT VALUE OF LOGICAL LEVEL "1"
  (3): NON-SELECTION SIDE HAS LOGICAL LEVEL "0" ⇒ RESISTANCE OF NON-SELECTION SIDE IS LARGE
  (4): NON-SELECTION SIDE ALSO HAS LOGICAL LEVEL "1" ⇒ RESISTANCE OF NON-SELECTION SIDE IS SMALL

RESISTANCE VALUE IS CHANGED ACCORDING TO LOGICAL LEVEL OF NON-SELECTION SIDE AND MEMORY CELL CURRENT VALUE INCREASES/DECREASES

FIG. 25B
RELATED ART

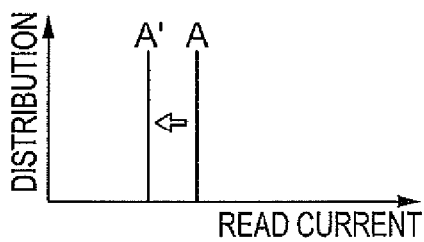

THRESHOLD VALUE OF CURRENT VALUE TO DETERMINE LOGICAL LEVEL
A: CHARACTERISTIC CHANGE OF SENSE AMPLIFIER IS NOT GENERATED
A': LOGICAL LEVEL IS DECREASED DUE TO CHARACTERISTIC CHANGE OF SENSE AMPLIFIER

FIG. 25C
RELATED ART

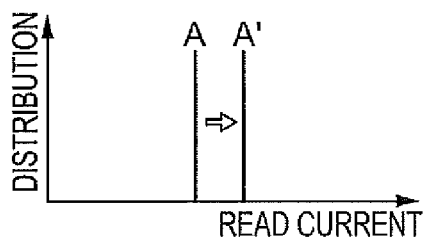

THRESHOLD VALUE OF CURRENT VALUE TO DETERMINE LOGICAL LEVEL
A: CHARACTERISTIC CHANGE OF SENSE AMPLIFIER IS NOT GENERATED
A': LOGICAL LEVEL IS INCREASED DUE TO CHARACTERISTIC CHANGE OF SENSE AMPLIFIER

FIG. 26A  RELATED ART

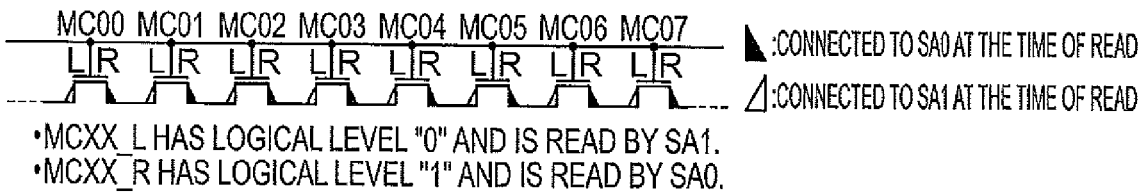

- MCXX_L HAS LOGICAL LEVEL "0" AND IS READ BY SA1.
- MCXX_R HAS LOGICAL LEVEL "1" AND IS READ BY SA0.

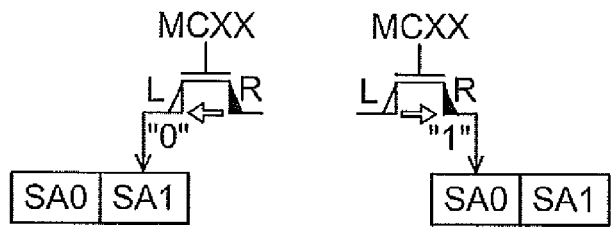

FIG. 26B  RELATED ART

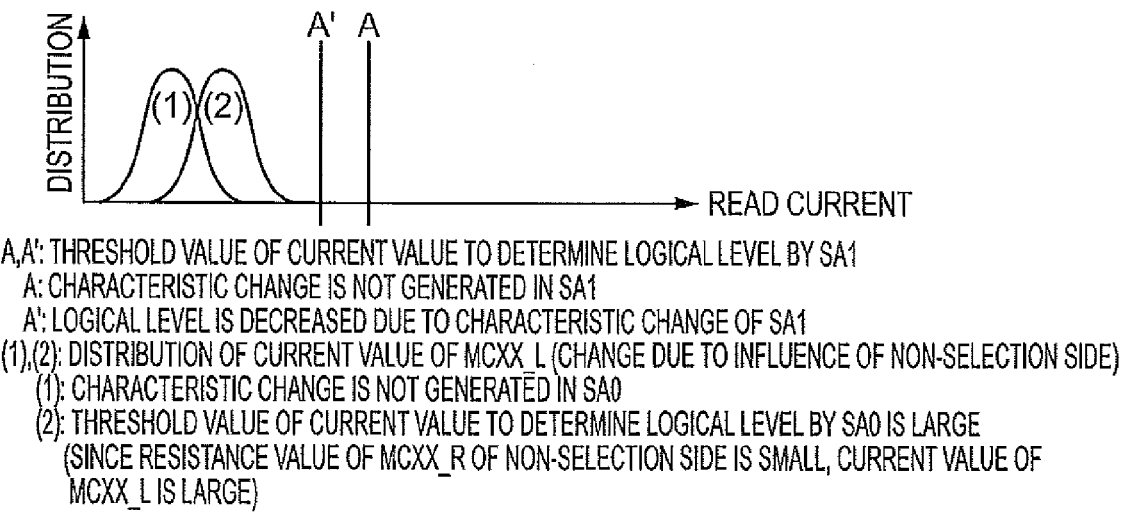

A,A': THRESHOLD VALUE OF CURRENT VALUE TO DETERMINE LOGICAL LEVEL BY SA1
  A: CHARACTERISTIC CHANGE IS NOT GENERATED IN SA1
  A': LOGICAL LEVEL IS DECREASED DUE TO CHARACTERISTIC CHANGE OF SA1
(1),(2): DISTRIBUTION OF CURRENT VALUE OF MCXX_L (CHANGE DUE TO INFLUENCE OF NON-SELECTION SIDE)
  (1): CHARACTERISTIC CHANGE IS NOT GENERATED IN SA0
  (2): THRESHOLD VALUE OF CURRENT VALUE TO DETERMINE LOGICAL LEVEL BY SA0 IS LARGE
    (SINCE RESISTANCE VALUE OF MCXX_R OF NON-SELECTION SIDE IS SMALL, CURRENT VALUE OF
    MCXX_L IS LARGE)

FIG. 26C  RELATED ART

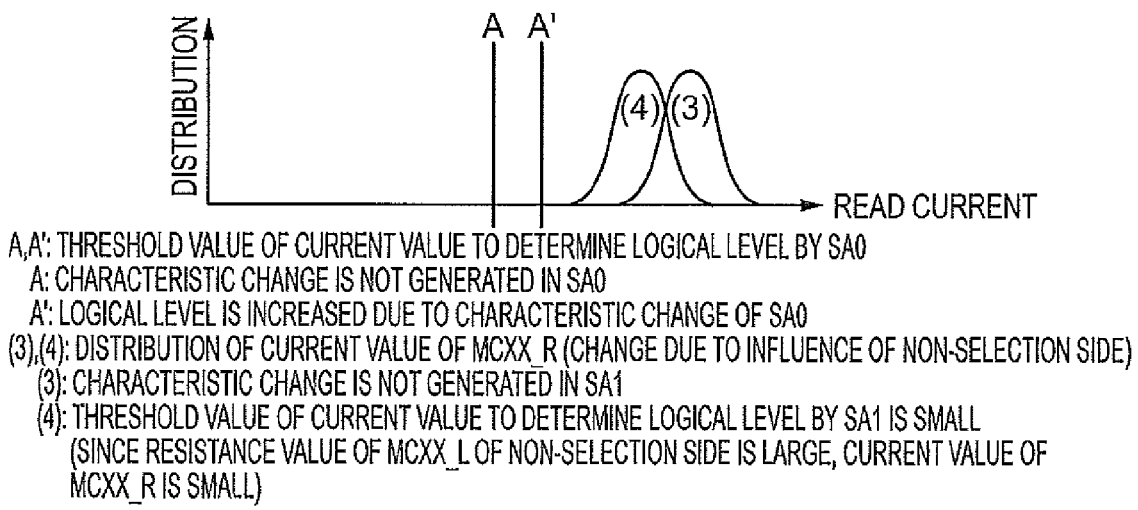

A,A': THRESHOLD VALUE OF CURRENT VALUE TO DETERMINE LOGICAL LEVEL BY SA0
  A: CHARACTERISTIC CHANGE IS NOT GENERATED IN SA0
  A': LOGICAL LEVEL IS INCREASED DUE TO CHARACTERISTIC CHANGE OF SA0
(3),(4): DISTRIBUTION OF CURRENT VALUE OF MCXX_R (CHANGE DUE TO INFLUENCE OF NON-SELECTION SIDE)
  (3): CHARACTERISTIC CHANGE IS NOT GENERATED IN SA1
  (4): THRESHOLD VALUE OF CURRENT VALUE TO DETERMINE LOGICAL LEVEL BY SA1 IS SMALL
    (SINCE RESISTANCE VALUE OF MCXX_L OF NON-SELECTION SIDE IS LARGE, CURRENT VALUE OF
    MCXX_R IS SMALL)

FIG.27A

- MCXX_L HAS LOGICAL LEVEL "0" AND MCXX_R HAS LOGICAL LEVEL "1"
- MCXX_L AND MCXX_R ARE READ BY SA0

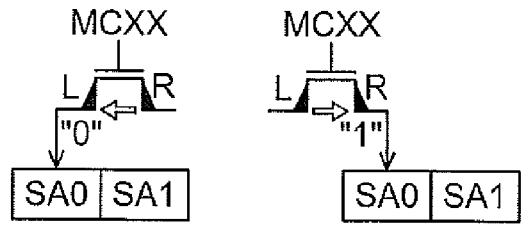

FIG.27B

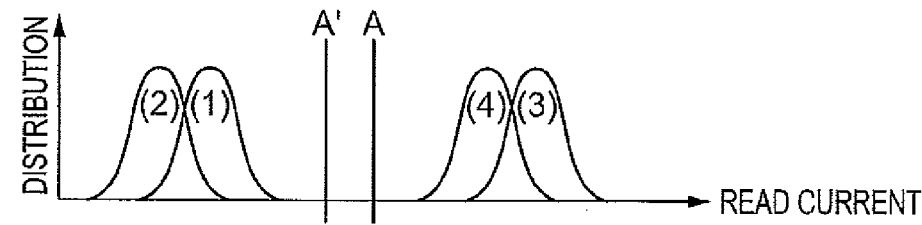

A,A': THRESHOLD VALUE OF CURRENT VALUE TO DETERMINE LOGICAL LEVEL BY SA0
 A: CHARACTERISTIC CHANGE IS NOT GENERATED IN SA0
 A': LOGICAL LEVEL IS DECREASED DUE TO CHARACTERISTIC CHANGE OF SA0
(1) TO (4): DISTRIBUTIONS OF CURRENT VALUES OF MCXX_L AND MCXX_R (CHANGE DUE TO INFLUENCE OF NON-SELECTION SIDE)
 (1),(3): CHARACTERISTIC CHANGE IS NOT GENERATED IN SA0
  (2): THRESHOLD VALUE OF CURRENT VALUE TO DETERMINE LOGICAL LEVEL BY SA0 IS SMALL
  (4): THRESHOLD VALUE OF CURRENT VALUE TO DETERMINE LOGICAL LEVEL BY SA0 IS SMALL
   (SINCE RESISTANCE VALUE OF NON-SELECTION SIDE IS LARGE, CURRENT VALUE OF SELECTION SIDE IS SMALL)

FIG.27C

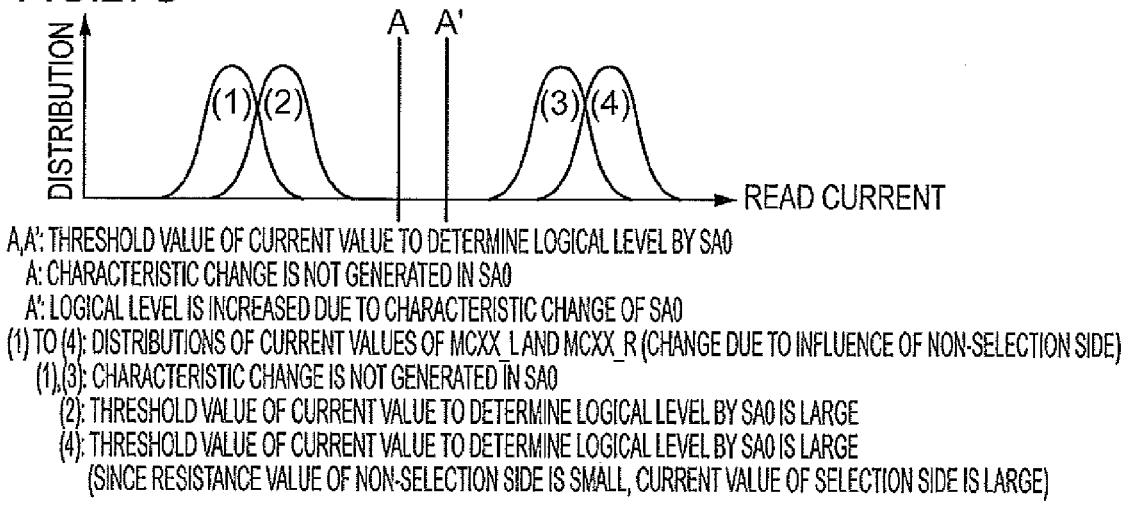

A,A': THRESHOLD VALUE OF CURRENT VALUE TO DETERMINE LOGICAL LEVEL BY SA0
 A: CHARACTERISTIC CHANGE IS NOT GENERATED IN SA0
 A': LOGICAL LEVEL IS INCREASED DUE TO CHARACTERISTIC CHANGE OF SA0
(1) TO (4): DISTRIBUTIONS OF CURRENT VALUES OF MCXX_L AND MCXX_R (CHANGE DUE TO INFLUENCE OF NON-SELECTION SIDE)
 (1),(3): CHARACTERISTIC CHANGE IS NOT GENERATED IN SA0
  (2): THRESHOLD VALUE OF CURRENT VALUE TO DETERMINE LOGICAL LEVEL BY SA0 IS LARGE
  (4): THRESHOLD VALUE OF CURRENT VALUE TO DETERMINE LOGICAL LEVEL BY SA0 IS LARGE
   (SINCE RESISTANCE VALUE OF NON-SELECTION SIDE IS SMALL, CURRENT VALUE OF SELECTION SIDE IS LARGE)

SEMICONDUCTOR STORAGE CIRCUIT

CROSS-REFERENCE TO RELATED APPLICATION

This application claims priority under 35 USC 119 from Japanese Patent Application No. 2010-039210, filed on Feb. 24, 2010, the disclosure of which is incorporated by reference herein.

BACKGROUND OF THE INVENTION

1. Field of the Invention

The present invention relates to a semiconductor storage circuit. In particular, the present invention relates to a semiconductor storage circuit that stores data of two bits in one memory cell.

2. Description of the Related Art

A conventional semiconductor storage circuit that stores data of two bits in one memory cell has been suggested (for example, refer to Japanese Patent Application Laid-Open (JP-A) No. 2006-309811). When data is read in a non-volatile semiconductor storage circuit, represented by a flash memory, a logical level of read data is determined based on a current value of a memory cell of a read object. A circuit that determines a logical level based on a distribution of memory cell current values between logical levels or a current difference (hereinafter, referred to as current window), is called a sense amplifier. A current of the memory cell of the read object flows into the sense amplifier through a connected bit line.

FIG. 21 is a block diagram showing the schematic configuration of a conventional NOR-type semiconductor storage circuit 1000 that stores data of two bits in one memory cell, which has been described in JP-A No. 2006-309811. FIG. 22 is a circuit diagram of a memory cell array 110 and a multiplexer 120 of the semiconductor storage circuit 1000. As shown in FIG. 21 and FIG. 22, the semiconductor storage circuit 1000 is configured to include the memory cell array 110, the multiplexer 120, and a sense amplifier 130. The sense amplifier 130 includes two sense amplifiers SA0 and SA1. The memory cell array 110 is configured to use multi-bit-type memory cells.

COMMMON is a common voltage source of the memory cells. DS [4M−1:0] are signals to select a sub-bit line connected to COMMON. SS [2M−1:0] are signals to select a sub-bit line connected to a main bit line. Y [J−1:0] are signals to select a main bit line connected to the sense amplifier. WL [N×M−1:0] are word lines. ICELL0 and ICELL1, shown in FIG. 23 to be described below, are current values of the memory cells of the read objects. ICELL0 and ICELL1 flows into the sense amplifier SA0 and the sense amplifier SA1, respectively. The sense amplifier SA0 and the sense amplifier SA1 determine the logical levels of the memory cells of the read objects, based on the current values ICELL0 and ICELL1, and output the logical levels to DOUT0 and DOUT1, respectively.

In this case, M is the number of memory cell arrays 110. N is the number of word lines that are included in each memory cell array 110. J is the number of main bit line selection signals Y. SBL [2(J+1):0] are sub-bit lines and MBL [J:0] are main bit lines. The M memory cell arrays 110 are connected to MBL [J:0]. However, FIG. 22 shows only one of the M memory cell arrays 110, and the sub-bit lines and the main bit lines are shown until SBL [8:0] and MBL [3:0], respectively.

Each memory cell array 110 is connected to terminals of the signals DS and SS to select the sub-bit lines not overlapped to other signal lines, to select the sub-bit lines included in each memory cell array. Note that, a transistor where "MC" is added as a prefix is a multi-bit-type memory cell. A transistor where "MD" is added as a prefix is a transistor (drain selector) to select the sub-bit line connected to COMMON, and a gate terminal thereof receives the sub-bit line selection signal DS (drain selection signal). The transistor where "MS" is added as a prefix is a transistor (source selector) to select the sub-bit line connected to the main bit line, and a gate terminal thereof receives the sub-bit line selection signal SS (source selection signal). A transistor where "MY" is added as a prefix is a transistor to select the main bit line connected to the sense amplifier, the main bit line selection signal Y is received in a gate terminal thereof.

As shown in the memory cell array 110, in the memory cell array of the NOR-type semiconductor storage circuit, plural word lines that are connected to the gate terminals of the memory cells and plural bit lines that are connected to the source terminals or the drain terminals (hereinafter, referred to as diffusion layers) are disposed in a matrix. The memory cells are disposed on intersections of the word lines and the bit lines, respectively. In this case, selection of the memory cell where data is read is realized by selecting the word line connected to the gate terminal of the memory cell, connecting the bit line connected to one diffusion layer to the sense amplifier, and connecting the other diffusion layer to COMMON.

A direction in which a memory cell current flows is different, according to which of the two diffusion layers of the memory cell is connected to the sense amplifier. The multi-bit-type memory cell of the memory cell array 110 may be adjusted to have a current value different according to each current direction. Thereby, the multi-bit-type memory cell realizes read of data of two bits or more. Here, it is assumed that the two diffusion layers of the memory cell are diffusion layers of the L side and the R side, respectively, and the side connected to the sense amplifier is a data read object. For example, when the L side of MC00 is connected to the sense amplifier, MC00_L becomes a data read object.

FIG. 23 and FIG. 24 are explanatory diagrams showing a data read operation of the semiconductor storage circuit 1000. Note that, FIG. 23 and FIG. 24 show only one of the M memory cell arrays 110 and one word line WL0 of the N word lines. The operation of the semiconductor storage circuit 1000 will be described using FIG. 23 and FIG. 24.

Referring to FIG. 23, the case where MC00_R and MC03_L are selected, will be described.

By selecting WL0 from the memory cell array 110, all of the memory cells including MC00 and MC03, which the gate terminal are connected to WL0, enter in a conductive state. By selecting DS0, MD00 and MD01 enter in a conductive state. Then, COMMON is connected to the diffusion layers of the MC00_L side and the MC03_R side through SBL0 and SBL4.

By selecting SS0, MS00 and MS01 enter in a conductive state. Then, MBL0 and the MBL1 are connected to the diffusion layers of the MC00_R side and the MC03_L side through SBL1 and SBL3. By selecting Y0, MY00 and MY01 of the multiplexer 120 enter in a conductive state. Then, MBL0 and MBL1 are connected to the sense amplifiers SA0 and SA1, respectively.

Thereby, MC00_R and MC03_L are selected, and currents ICELL0 and ICELL1 flow into the sense amplifiers SA0 and SA1, respectively. The sense amplifier SA0 and the sense amplifier SA1 output logical levels, which are determined on the basis of the currents ICELL0 and ICELL1, to DOUT0 and DOUT1, respectively.

Referring to FIG. 24, the case where MC03_R and MC06_L are selected, will be described.

By selecting WL0 from the memory cell array 110, all of the memory cells including MC03 and MC06, which the gate terminal are connect to WL0, enter in a conductive state. By selecting DS3, MD30 and MD31 enter in a conductive state. Then, COMMON is connected to the diffusion layers of the MC03_L side and the MC06_R side through SBL3 and SBL7.

By selecting SS1, MS11 and MS12 enter in a conductive state. Then, MBL1 and MBL2 are connected to the diffusion layers of the MC03_R side and the MC06_L side through SBL4 and SBL6. By selecting Y1, MY10 and MY11 of the multiplexer 120 enter in a conductive state. Then, MBL1 and MBL2 are connected to the sense amplifiers SA0 and SA1, respectively.

Thereby, MC03_R and MC06_L are selected, and the currents ICELL0 and ICELL1 flow into the sense amplifier SA0 and the sense amplifier SA1, respectively. The sense amplifier SA0 and the sense amplifier SA1 output logical levels, which are determined on the basis of the currents ICELL0 and ICELL1, to DOUT0 and DOUT1, respectively.

Here, when the $(2\alpha+\beta)$-th SS ($\alpha$ is 0, 1, 2, ..., and M−1 and $\beta$=0, 1) and the even-numbered Y are selected, the $((2\alpha+0)\times 2+\beta)$-th DS is selected. Thus, when the odd-numbered Y is selected, $((2\alpha+1)\times 2+\beta)$-th DS is selected.

Accordingly, the conventional semiconductor storage circuit 1000 simultaneously selects a pair of main bit lines adjacent to each other, and connects the main bit lines to the sense amplifiers, respectively. The sense amplifier SA0 reads and uses data of the R side of the memory cell, such as MC00_R and MC03_R. The sense amplifier SA1 reads and uses data of the L side of the memory cell, such as MC03_L and MC06_L. Therefore, in the semiconductor storage circuit 1000, the different sense amplifiers read and use the different data of the L side and the R side, even in the same memory cell, such as MC03_L and MC03_R.

The memory cell current value is affected by the logical level of the non-selection side of the same memory cell. For example, a memory cell current value of MC00_L is affected by a logical level of MC00_R. Likewise, a memory cell current value of MC00_R is affected by a logical level of MC00_L. The logical level of the non-selection side affects the memory cell current value like resistance. A resistance value thereof is large when a logical level is "0" and is small when the logical level is "1." Therefore, as shown in FIG. 25A, when the logical level of the non-selection side is "0," the memory cell current value is distributed with a small current value, and when the logical level of the non-selection side is "1," the memory cell current value is distributed with a large current value. Since a small current value is preferable at the time of determining the logical level of "0," the logical level of the non-selection side is preferably "0" at the time of reading the logical level of "0." Likewise, since a large current value is preferable at the time of determining the logical level of "1," the logical level of the non-selection side is preferably "1" at the time of reading the logical level of "1."

Meanwhile, a characteristic of the sense amplifier is changed due to the process change. Thereby, a threshold value of the memory cell current value that is used to determine the logical level is different for each sense amplifier. For example, in the case where data is read by the sense amplifiers having characteristics shown in FIG. 25B and FIG. 25C, the sense amplifier of FIG. 25B may not determine the logical level as "0" when the current value is not small, and the sense amplifier of FIG. 25C may not determine the logical level as "1" when the current value is not large.

As shown in FIG. 26A, the case where MCXX_L and MCXX_R have the logical levels "0" and "1," respectively, will be described. Note that MCXX may be any memory cell in the memory cell array 110.

In FIG. 26B, a case where characteristics of the sense amplifier SA0 and the sense amplifier SA1 are as shown in FIG. 25B and FIG. 25C, when reading out data from MCXX_L including a data of logical level "0". Due to the characteristic change of the sense amplifier SA1, the threshold value of the memory cell current value to determine the logical level is decreased from A to A'. Further, due to the characteristic change of the sense amplifier SA0, the current value of MCXX_R is distributed with a relatively large current value. Accordingly, the memory cell current value of the logical level "0" is distributed as shown in (2) of FIG. 26B. When a gap between A' and (2) decreases, a data read characteristic of the logical level "0" deteriorates.

In FIG. 26C, a case where characteristics of the sense amplifier SA0 and the sense amplifier SA1 are as shown in FIG. 25B and FIG. 25C, when reading out data from MCXX_R including a data of logical level "1". Due to the characteristic change of the sense amplifier SA0, the threshold value of the memory cell current value to determine the logical level is increased from A to A'. Further, due to the characteristic change of the sense amplifier SA1, the current value of MCXX_L is distributed with a relatively small current value. Accordingly, the memory cell current value of the logical level "1" is distributed with as shown in (4) of FIG. 26C. When a gap between of A' and (4) decreases, a data read characteristic of the logical level "1" deteriorates.

SUMMARY OF THE INVENTION

Accordingly, the present invention provides a semiconductor storage circuit which may suppress a data read characteristic from being deteriorated due to an influence of a characteristic change of a sense amplifier, when reading data in a multi-bit-type memory cell.

A first aspect of the present invention is a semiconductor storage circuit including: a plurality of word lines disposed in a row direction; a plurality of sub-bit lines disposed in a column direction that intersect the plurality of word lines; a plurality of main bit lines each provided for a group of adjacent sub-bit lines; a plurality of non-volatile memory cells, each provided at an intersecting portion of the word lines and the sub-bit lines and including a control electrode connected to the word line of the intersecting portion, a first electrode connected to the sub-bit line of the intersecting portion, and a second electrode connected to a sub-bit line adjacent to the sub-bit line connected to the first electrode, wherein one bit of information is read from each of the first electrode and the second electrode of the non-volatile memory cell, by changing a direction of a voltage applied between the first and second electrodes when the non-volatile memory cell is selected by the word line; a plurality of drain selectors that are provided between one end of the sub-bit lines and a common power supply, and that connects the sub-bit lines, that are connected to a non-selection-side electrode of the first and second electrodes of the two memory cells of read objects, to the common power supply, in a case in which drain selection signals corresponding to two memory cells are supplied; a plurality of source selectors, that are provided between the other ends of the sub-bit lines and the main bit lines, and that connects the sub-bit lines, that are connected to the selection-side electrode of the first and second electrodes of the two memory cells, to two adjacent main bit lines, in a case which source selection signals corresponding to the two memory cells are supplied; a first sense amplifier that reads data of one of the two memory cells; a second sense amplifier that reads data of the other of the two memory cells; and a connecting section that connects a main bit line connected to an even-numbered memory cell in a row direction in the two memory cells of the read objects to the first sense amplifier, and that connects a main bit line connected to an odd-numbered memory cell in the row direction in the two memory cells to the second sense amplifier.

A second aspect of the present invention, in the above first aspect, the connecting section may include: a first multiplexer that connects the main bit line, which is connected to the second electrode of the even-numbered memory cell in the row direction in the two memory cells, to the first sense amplifier, and that connects the main bit line, which is connected to the first electrode of the odd-numbered memory cell in the row direction in the two memory cells, to the second sense amplifier, and a second multiplexer that connects the main bit line, which is connected to the first electrode of the even-numbered memory cell in the row direction in the two memory cells, to the first sense amplifier, and that connects the main bit line, which is connected to the second electrode of the odd-numbered memory cell in the row direction in the two memory cells, to the second sense amplifier.

A third aspect of the present invention, in the above first aspect, the connecting section may include: a multiplexer that connects the main bit line, which is connected to the second electrode of the even-numbered memory cell in the row direction in the two memory cells, to a first data output line, that connects the main bit line, which is connected to the first electrode of the odd-numbered memory cell in the row direction in the two memory cells, to a second data output line adjacent to the first data output line, that connects the main bit line, which is connected to the first electrode of the even-numbered memory cell in the row direction in the two memory cells, to the second data output line, and that connects the main bit line, which is connected to the second electrode of the odd-numbered memory cell in the row direction in the two memory cells, to the first data output line, and a sense amplifier selecting circuit that connects the first data output line, which is connected to the second electrode of the even-numbered memory cell in the row direction in the two memory cells, to the first sense amplifier, that connects the second data output line, which is connected to the first electrode of the odd-numbered memory cell in the row direction in the two memory cells, to the second sense amplifier, that connects the first data output line, which is connected to the first electrode of the even-numbered memory cell in the row direction in the two memory cells, to the first sense amplifier, and that connects the second data output line, which is connected to the second electrode of the odd-numbered memory cell in the row direction in the two memory cells, to the second sense amplifier.

A fourth aspect of the present invention, in the above first aspect, the connecting section may include: a first multiplexer that connects the main bit line, which is connected to the second electrode of the even-numbered memory cell in the row direction in the two memory cells, to a first data output line, that connects the main bit line, which is connected to the first electrode of the odd-numbered memory cell in the row direction in the two memory cells, to a second data output line adjacent to the first data output line, that connects the main bit line, which is connected to the first electrode of the even-numbered memory cell in the row direction in the two memory cells, to a third data output line, and that connects the main bit line, which is connected to the second electrode of the odd-numbered memory cell in the row direction in the two memory cells, to a fourth data output line adjacent to the third data output line, a second multiplexer that connects the first data output line, which is connected to the second electrode of the even-numbered memory cell in the row direction in the two memory cells, to the first sense amplifier, and that connects the second data output line, which is connected to the first electrode of the odd-numbered memory cell in the row direction in the two memory cells, to the second sense amplifier, and a third multiplexer that connects the third data output line, which is connected to the first electrode of the even-numbered memory cell in the row direction in the two memory cells, to the first sense amplifier, and that connects the fourth data output line, which is connected to the second electrode of the odd-numbered memory cell in the row direction in the two memory cells, to the second sense amplifier.

A fifth aspect of the present invention, in the above first aspect, the connecting section may include: a first multiplexer that connects the main bit line, which is connected to the second electrode of the even-numbered memory cell in the row direction in the two memory cells, to a first data output line, that connects the main bit line, which is connected to the first electrode of the odd-numbered memory cell in the row direction in the two memory cells, to a second data output line adjacent to the first data output line, that connects the main bit line, which is connected to the first electrode of the even-numbered memory cell in the row direction in the two memory cells, to a third data output line, and that connects the main bit line, which is connected to the second electrode of the odd-numbered memory cell in the row direction in the two memory cells, to a fourth data output line adjacent to the third data output line, a second multiplexer that connects the first data output line, which is connected to the second electrode of the even-numbered memory cell in the row direction in the two memory cells, to a fifth data output line, that connects the second data output line, which is connected to the first electrode of the odd-numbered memory cell in the row direction in the two memory cells, to a sixth data output line adjacent to the fifth data output line, that connects the third data output line, which is connected to the first electrode of the even-numbered memory cell in the row direction in the two memory cells, to the sixth data output line, and that connects the fourth data output line, which is connected to the second electrode of the odd-numbered memory cell in the row direction in the two memory cells, to the fifth data output line, and a sense amplifier selecting circuit that connects the fifth data output line, which is connected to the second electrode of the even-numbered memory cell in the row direction in the two memory cells, to the first sense amplifier, that connects the sixth data output line, which is connected to the first electrode of the odd-numbered memory cell in the row direction in the two memory cells, to the second sense amplifier, that connects the sixth data output line, which is connected to the first electrode of the even-numbered memory cell in the row direction in the two memory cells, to the first sense amplifier, and that connects the fifth data output line, which is connected to the second electrode of the odd-numbered memory cell in the row direction in the two memory cells, to the second sense amplifier.

A sixth aspect of the present invention, in the above aspects, an even number of the plurality of memory cells may be disposed between adjacent main bit lines.

According to the aspects of the present invention, a data read characteristic may be suppressed from being deteriorated due to an influence of a characteristic change of a sense amplifier, when reading data in a multi-bit-type memory cell.

BRIEF DESCRIPTION OF THE DRAWINGS

Exemplary embodiments of the present invention will be described in detail based on the following figures, wherein:

FIG. 25A to FIG. 25C are explanatory diagrams showing a relationship of a characteristic change of a sense amplifier and data read in the conventional semiconductor storage circuit;

FIG. 26A to FIG. 26C are explanatory diagrams showing a relationship of a characteristic change of a sense amplifier and data read in the conventional semiconductor storage circuit; and FIG. 27A to FIG. 27C are explanatory diagrams showing a relationship of a characteristic change of a sense amplifier and data read in the semiconductor storage circuit according to the exemplary embodiments.

DETAILED DESCRIPTION OF THE INVENTION

Hereinafter, exemplary embodiments of the present invention will be described in detail with reference to the drawings.

First Exemplary Embodiment

Figure 1:
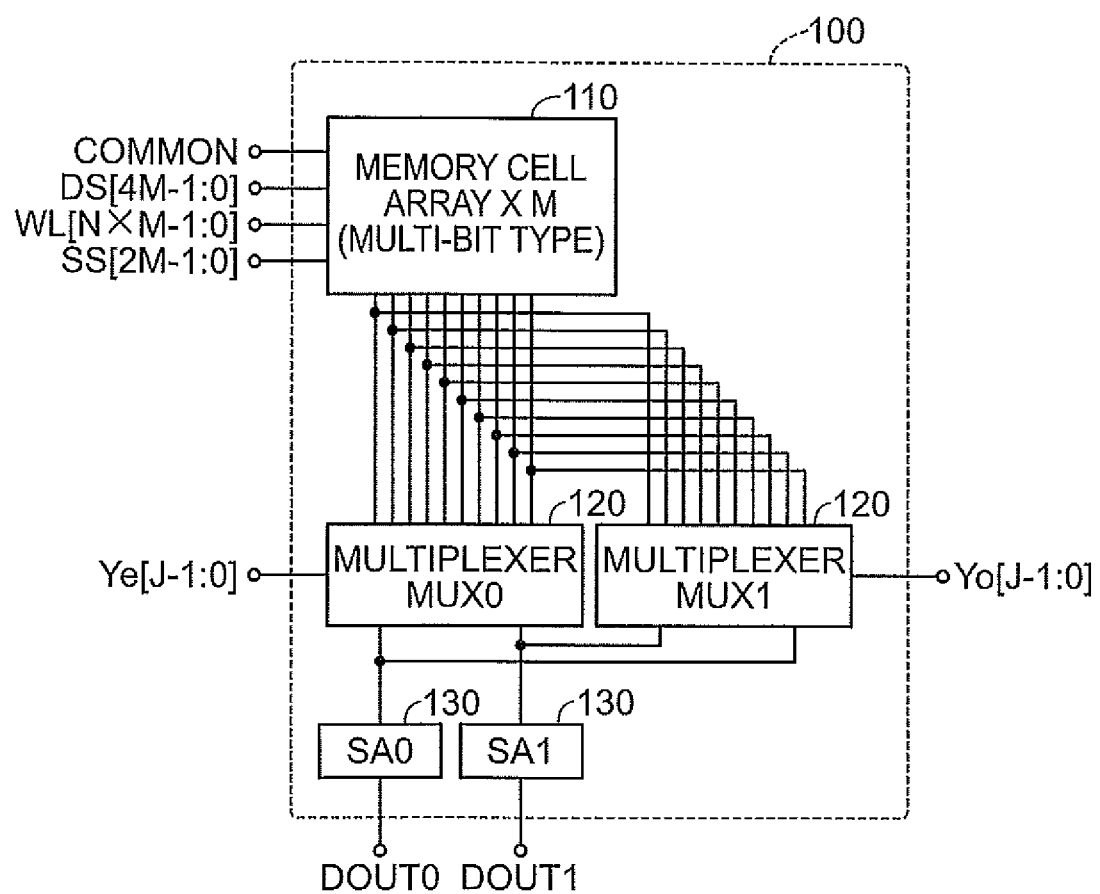
FIG. 1 is a block diagram showing the schematic configuration of a semiconductor storage circuit according to a first exemplary embodiment.
Figure 2:
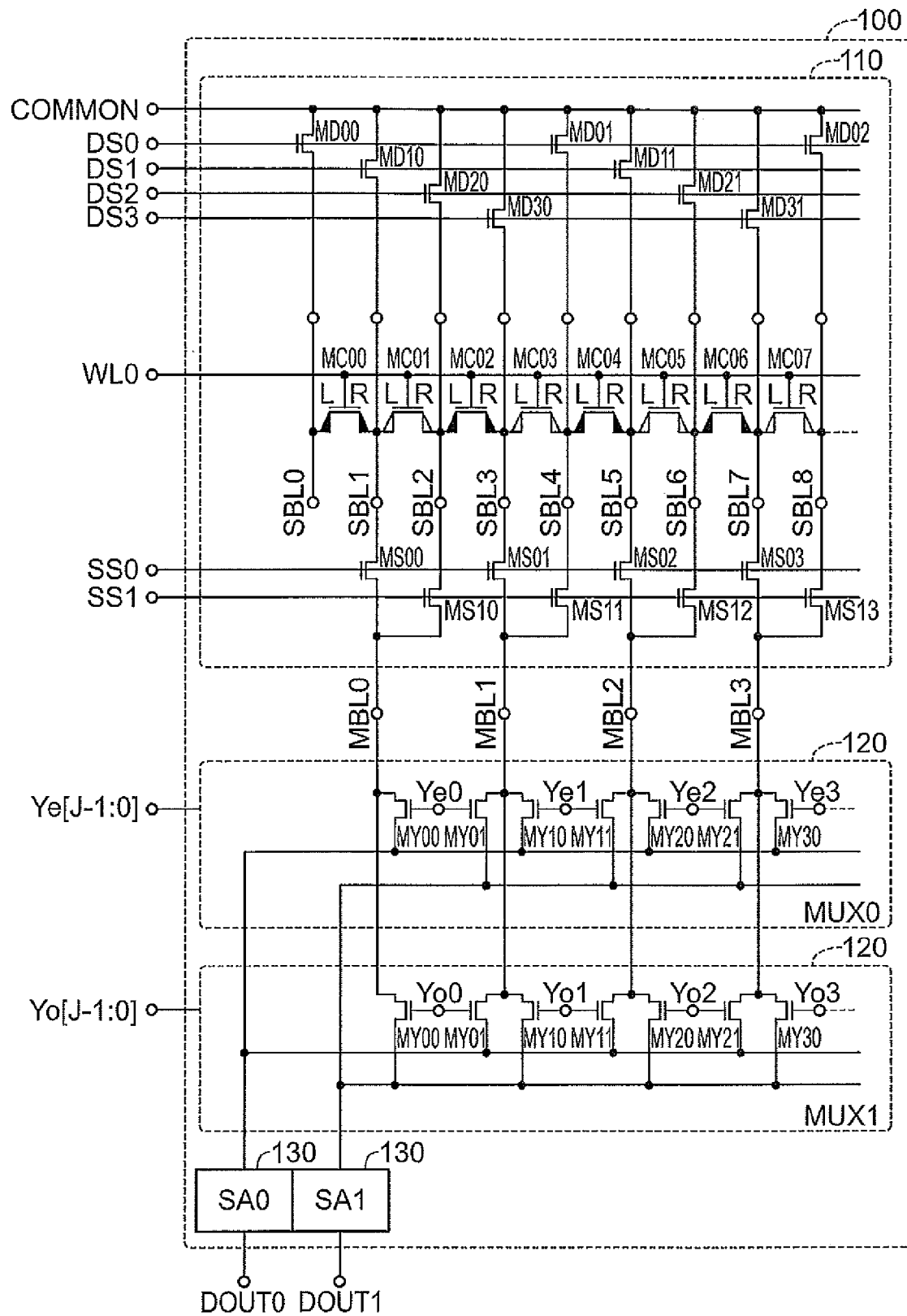
FIG. 2 is a circuit diagram of the semiconductor storage circuit according to the first exemplary embodiment.

FIG. 1 is a block diagram showing the schematic configuration of a semiconductor storage circuit 100 according to a first exemplary embodiment of the present invention. FIG. 2 is a circuit diagram of a memory cell array 110, and a multiplexer 120 of the semiconductor storage circuit 100. The same components as those of the semiconductor storage circuit according to the related art are denoted by the same reference numerals and the detailed description thereof is omitted.

As shown in FIG. 1 and FIG. 2, the semiconductor storage circuit 100 is configured to include the memory cell array 110, the multiplexer 120, and a sense amplifier 130. The multiplexer 120 includes two multiplexers MUX0 and MUX1. The sense amplifier 130 includes two sense amplifiers SA0 and SA1. Ye [J−1:0] and Yo [J−1:0] are signals to select main bit lines connected to the sense amplifiers. Note that "J" denotes the number of signal line of Ye and Yo that selects the main bit lines. Since the other configuration is the same as that of the semiconductor storage circuit 1000, the description thereof is omitted.

Figure 3:
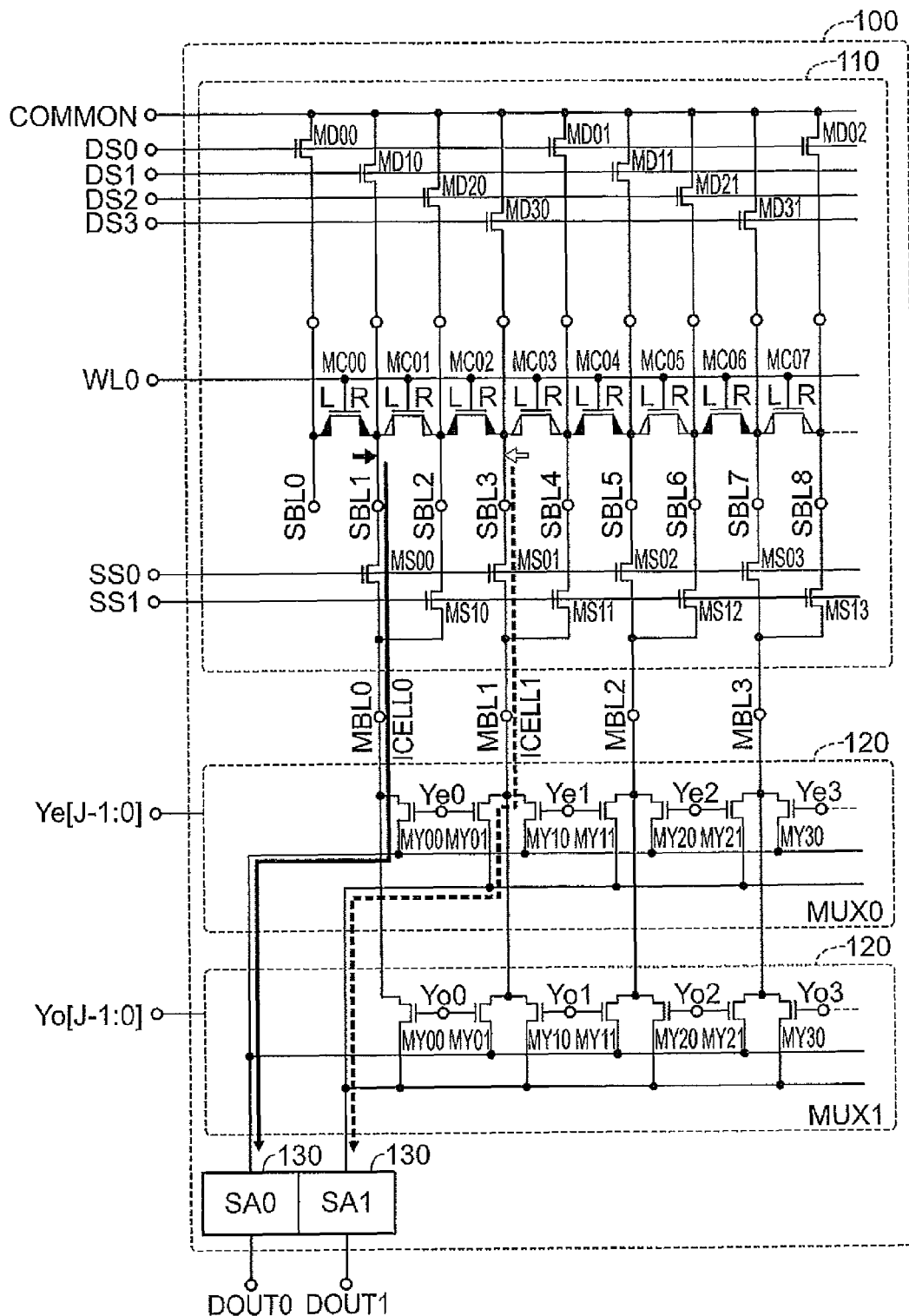
FIG. 3 is a diagram showing an operation of the semiconductor storage circuit according to the first exemplary embodiment.
Figure 4:
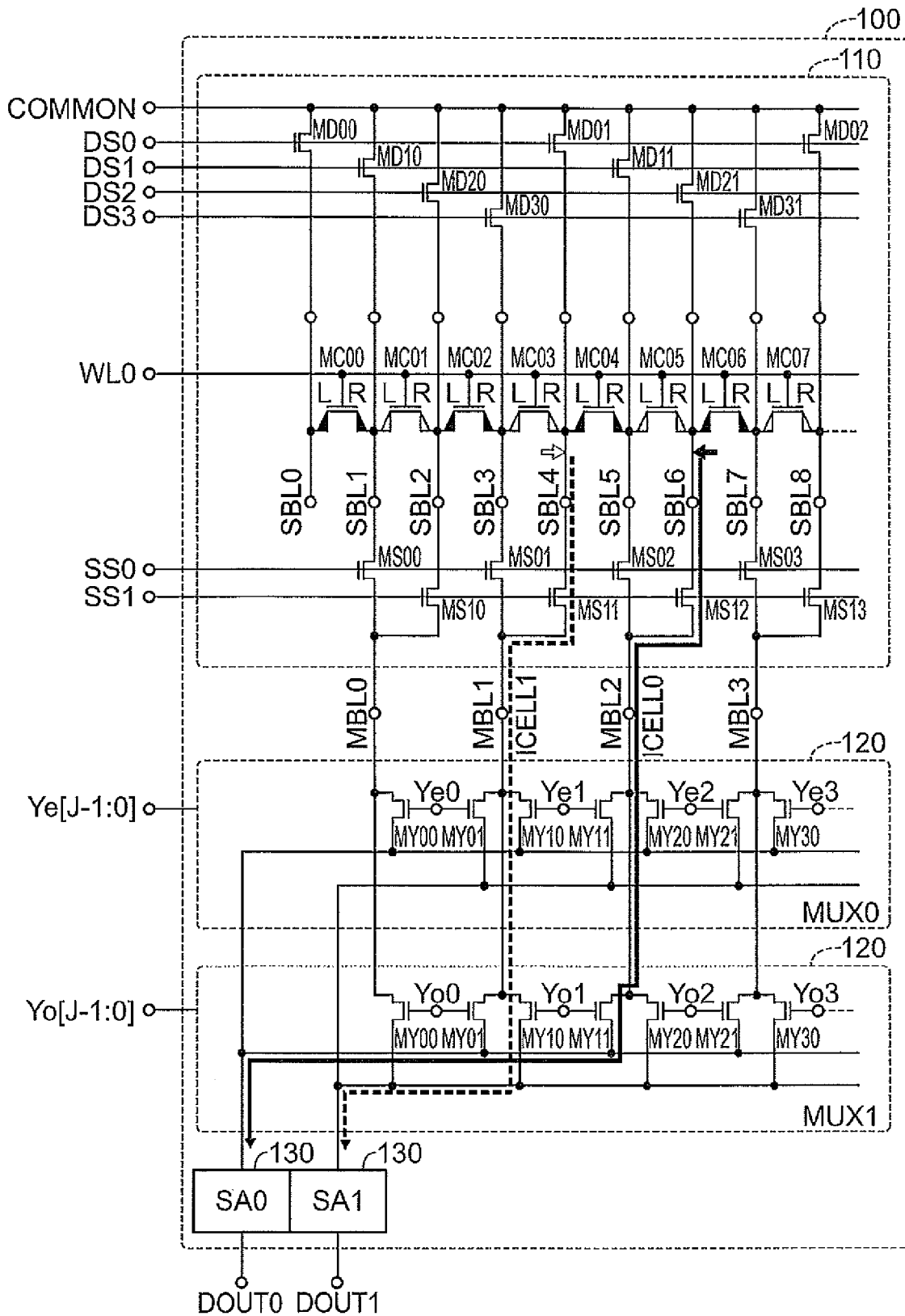
FIG. 4 is a diagram showing an operation of the semiconductor storage circuit according to the first exemplary embodiment.

FIG. 3 and FIG. 4 show a data read operation in the semiconductor storage circuit 100. However, FIG. 3 and FIG. 4 show only one of the M memory cell arrays 110 and one word line WL0 of N word lines. The operation of the semiconductor storage circuit 100 will be described using FIG. 3 and FIG. 4.

Referring to FIG. 3, a case where MC00_R and MC03_L are selected will be described.

By selecting WL0 by the memory cell array 110, all of the memory cells including MC00 and MC03 which a gate terminal thereof are connected to WL0 enter in a conductive state. By selecting DS0, MD00 and MD01 enter in a conductive state. Then, COMMON is connected to diffusion layers of the MC00_L side and the MC03_R side through SBL0 and SBL4.

By selecting SS0, MS00 and MS01 enter in a conductive state. Next, MBL0 and MBL1 are connected to the diffusion layers of the MC00_R side and the MC03_L side through SBL1 and SBL3.

By selecting Ye0, MY00 and MY01 of the multiplexer MUX0 enter in a conductive state. Then, MBL0 and MBL1 are connected to the sense amplifiers SA0 and SA1, respectively. Thereby, MC00_R and MC03_L are selected, and currents ICELL0 and ICELL1 flow into the sense amplifier SA0 and the sense amplifier SA1, respectively. The sense amplifier SA0 and the sense amplifier SA1 output logical levels, which are determined on the basis of the currents ICELL0 and ICELL1, to DOUT0 and DOUT1, respectively.

Referring to FIG. 4, a case where MC03_R and MC06_L are selected will be described.

By selecting WL0 by the memory cell array 110, all of the memory cells including MC03 and MC06 which the gate terminal thereof are connected to WL0, enter in a conductive state. By selecting DS3, MD30 and MD31 enter in a conductive state. Then, COMMON is connected to the diffusion layers of the MC03_L side and the MC06_R side through SBL3 and SBL7.

By selecting SS1, MS11 and MS12 enter in a conductive state. Then, MBL1 and MBL2 are connected to the diffusion layers of the MC03_R side and the MC06_L side through SBL4 and SBL6. By selecting Yo1, MY10 and MY11 of the multiplexer MUX1 enter in a conductive state. Then, MBL1 and MBL2 are connected to the sense amplifiers SA1 and SA0, respectively. Thereby, MC03_R and MC06_L are selected, and currents ICELL1 and ICELL0 flow into the sense amplifier SA1 and the sense amplifier SA0, respectively. The sense amplifier SA0 and the sense amplifier SA1 output logical levels, which are determined on the basis of the currents ICELL0 and ICELL1, to DOUT0 and DOUT1, respectively.

Here, in the multiplexers MUX0 and MUX1, when the semiconductor storage circuit 100 selects the even-numbered SS, the multiplexers MUX0 and MUX1 connect the memory cell using the R side to the sense amplifier SA0 and connect the memory cell using the L side to the sense amplifier SA1. Namely, the semiconductor storage circuit 100 selects Ye. Meanwhile, when the semiconductor storage circuit 100 selects the odd-numbered SS, the multiplexers MUX0 and MUX1 connect the memory cell using the R side to the sense amplifier SA1 and connect the memory cell using the L side to the sense amplifier SA0. Namely, the semiconductor storage circuit 100 selects Yo.

Further, When the semiconductor storage circuit 100 selects the $(2\alpha+\beta)$-th SS ($\alpha$ is 0, 1, 2, ..., and M−1 and $\beta$=0, 1) and the even-numbered Ye or Yo, the semiconductor storage circuit 100 selects the $((2\alpha+0)\times2+\beta)$-th DS. When the semiconductor storage circuit 100 selects the odd-numbered Ye or Yo, the semiconductor storage circuit 100 selects the $((2\alpha+1)\times2+\beta)$-th DS.

The semiconductor storage circuit 100 simultaneously selects a pair of main bit lines to be adjacent to each other, and connects the main bit lines to the sense amplifiers, respectively. The sense amplifier SA0 is used to read data of the even-numbered memory cell, such as MC00_R and MC06_L.

Meanwhile, the sense amplifier SA1 is used to read data of the odd-numbered memory cell, such as MC03_L and MC03_R. Therefore, in the semiconductor storage circuit 100 according to this exemplary embodiment, the same sense amplifier reads and uses data of the L side and the R side of the same memory cell, such as MC03_L and MC03_R.

Hereinafter, a case where MCXX_L and MCXX_R have the logical levels "0" and "1" as shown in FIG. 27A, respectively, is described. Note that, MCXX is an arbitrary memory cell of the memory cell array 110. When the sense amplifier SA0 shows a characteristic as explained in FIG. 25B, a memory cell current value of MCXX_L needs to be adjusted to be relatively small, to determine the logical level of MCXX_L as "0." For this reason, the memory cell current value of MCXX_R is distributed with a relatively small value, and the case where the logical level of MCXX_R is "1" becomes disadvantageous. However, data of MCXX_R is read using the same sense amplifier SA0 as the case of MCXX_L. Since the sense amplifier SA0 shows a characteristic as explained in FIG. 25B, the logical level may be determined as "1" even in the relatively small memory cell current value. This may balance out the influence of MCXX_L, and suppress an influence of the characteristic change of the sense amplifier.

In FIG. 27B, due to the characteristic change of the sense amplifier SA0, a threshold value of the memory cell current value that is used to determine the logical level is decreased from A to A'. Meanwhile, the distribution of the memory cell current value of the logical level "0" is shifted from (1) to (2), as labeled in FIG. 27B. As such, the semiconductor storage circuit 100 according to this exemplary embodiment may balance out the influence of the characteristic change of the sense amplifier.

Referring to FIG. 27C, a case where the connected sense amplifier has a characteristic of FIG. 25C will be described. In this case, the logical level of MCXX_L is "0" and the logical level of MCXX_R is "1." In FIG. 27C, due to the characteristic change of the sense amplifier SA0, the threshold value of the memory cell current value that is used to determine the logical level is increased from A to A', and the distribution of the memory cell current value of the logical level "1" is shifted from (3) to (4), as labeled in FIG. 27C. Accordingly, the semiconductor storage circuit 100 according to the first exemplary embodiment may balance out the influence of the characteristic change of the sense amplifier.

Second Exemplary Embodiment

Next, the second exemplary embodiment of the present invention will be described. The same components as those of the above-described semiconductor storage circuit are denoted by the same reference numerals and the detailed description thereof is omitted.

Figure 5:
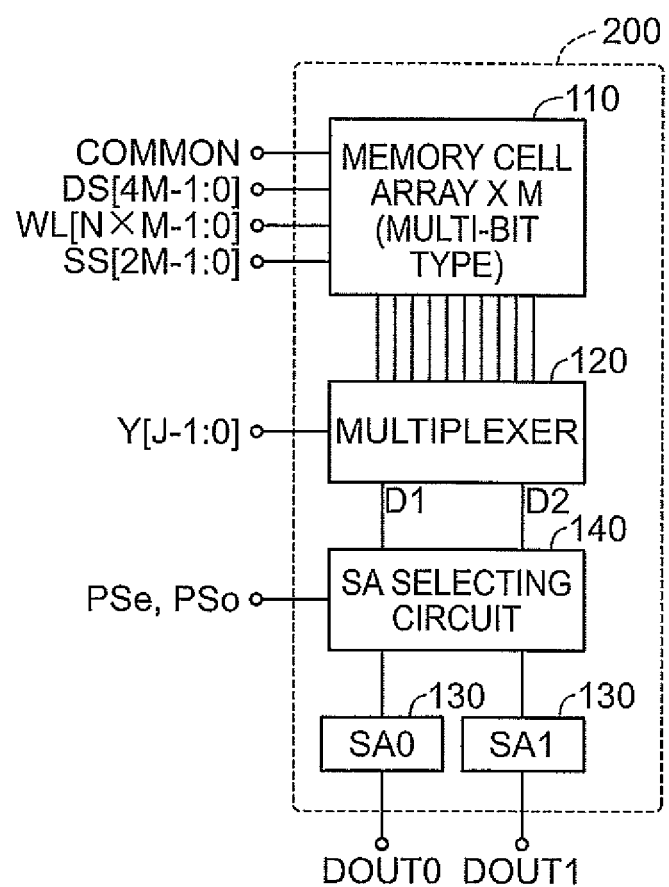
FIG. 5 is a block diagram showing the schematic configuration of a semiconductor storage circuit according to a second exemplary embodiment.
Figure 6:
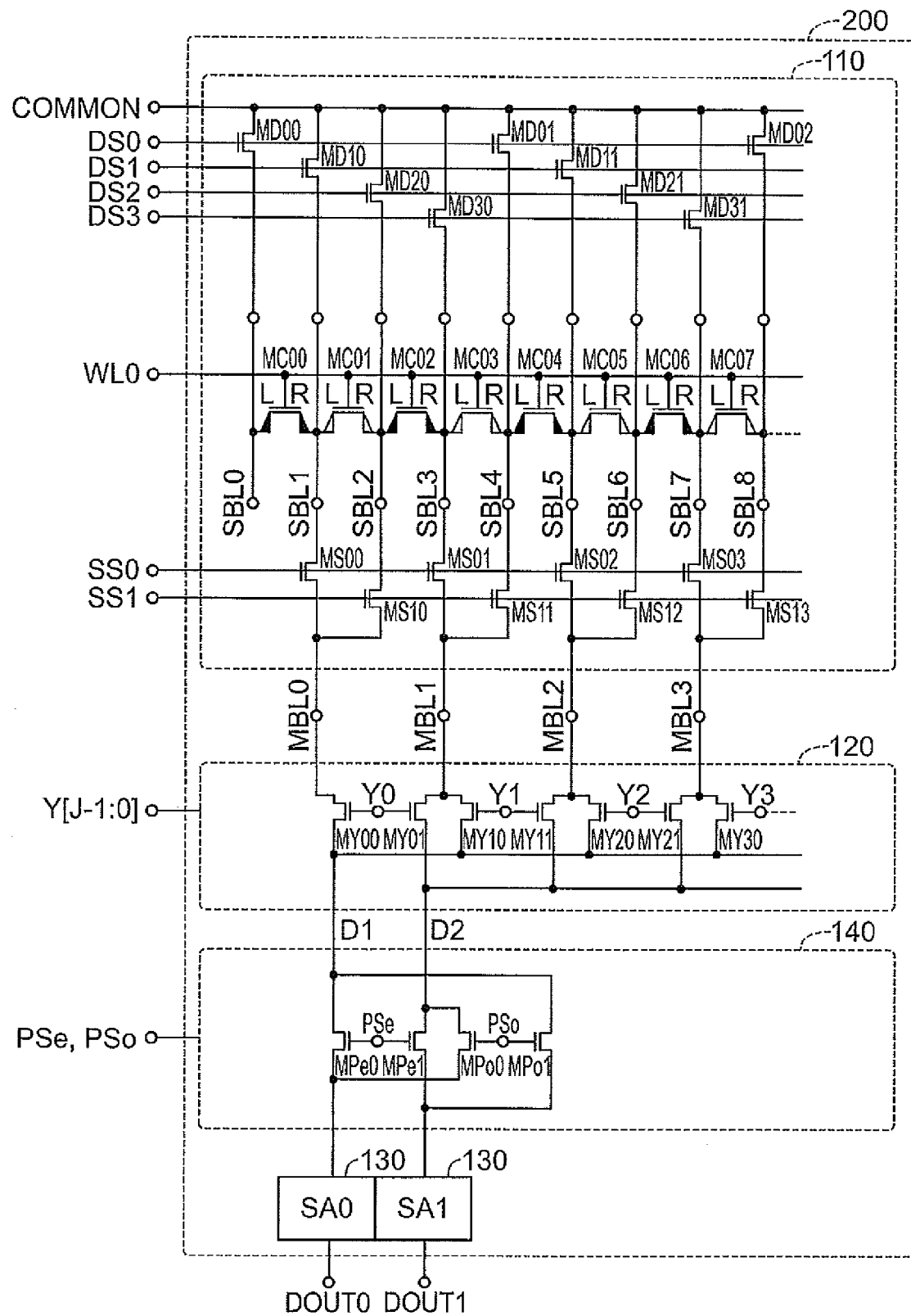
FIG. 6 is a circuit diagram of the semiconductor storage circuit according to the second exemplary embodiment.

FIG. 5 is a block diagram showing the schematic configuration of a semiconductor storage circuit 200 according to the second exemplary embodiment of the present invention. FIG. 6 is a circuit diagram of a memory cell array 110, a multiplexer 120, and a SA selecting circuit 140 of the semiconductor storage circuit 200.

As shown in FIG. 5 and FIG. 6, the semiconductor storage circuit 200 is configured to include the memory cell array 110, the multiplexer 120, the sense amplifier 130, and the SA selecting circuit 140. The sense amplifier 130 includes two sense amplifiers SA0 and SA1. PSe and PSo are signals to select main bit lines connected to the sense amplifiers. In this case, a transistor where "MP" is added as a prefix is a transistor to select the main bit line connected to the sense amplifier, and a gate terminal thereof receives the main bit line selection signal PSe or PSo. Since the other configuration is the same as that of the semiconductor storage circuit 1000, the description thereof is omitted.

Figure 7:
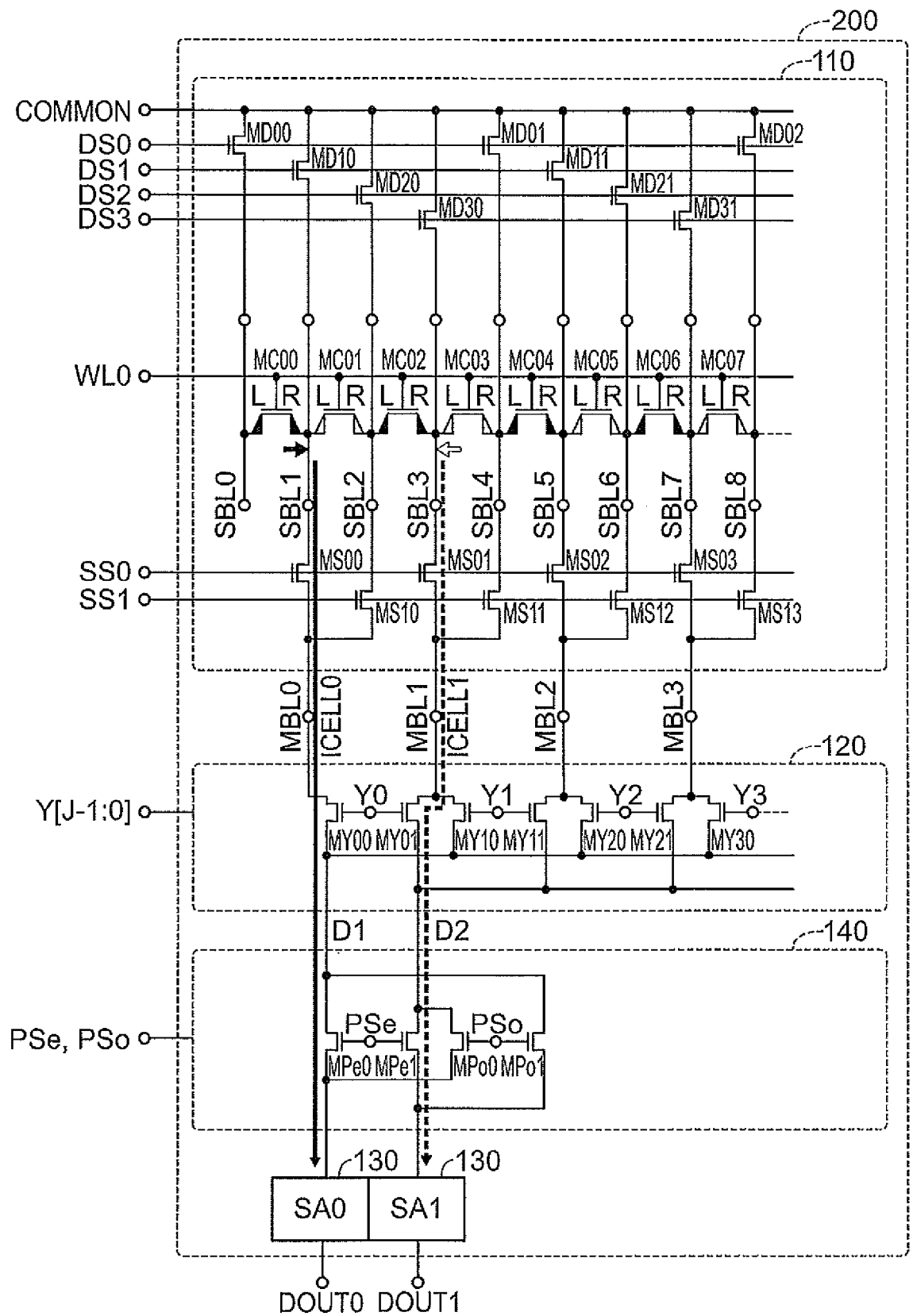
FIG. 7 is a diagram showing an operation of the semiconductor storage circuit according to the second exemplary embodiment.
Figure 8:
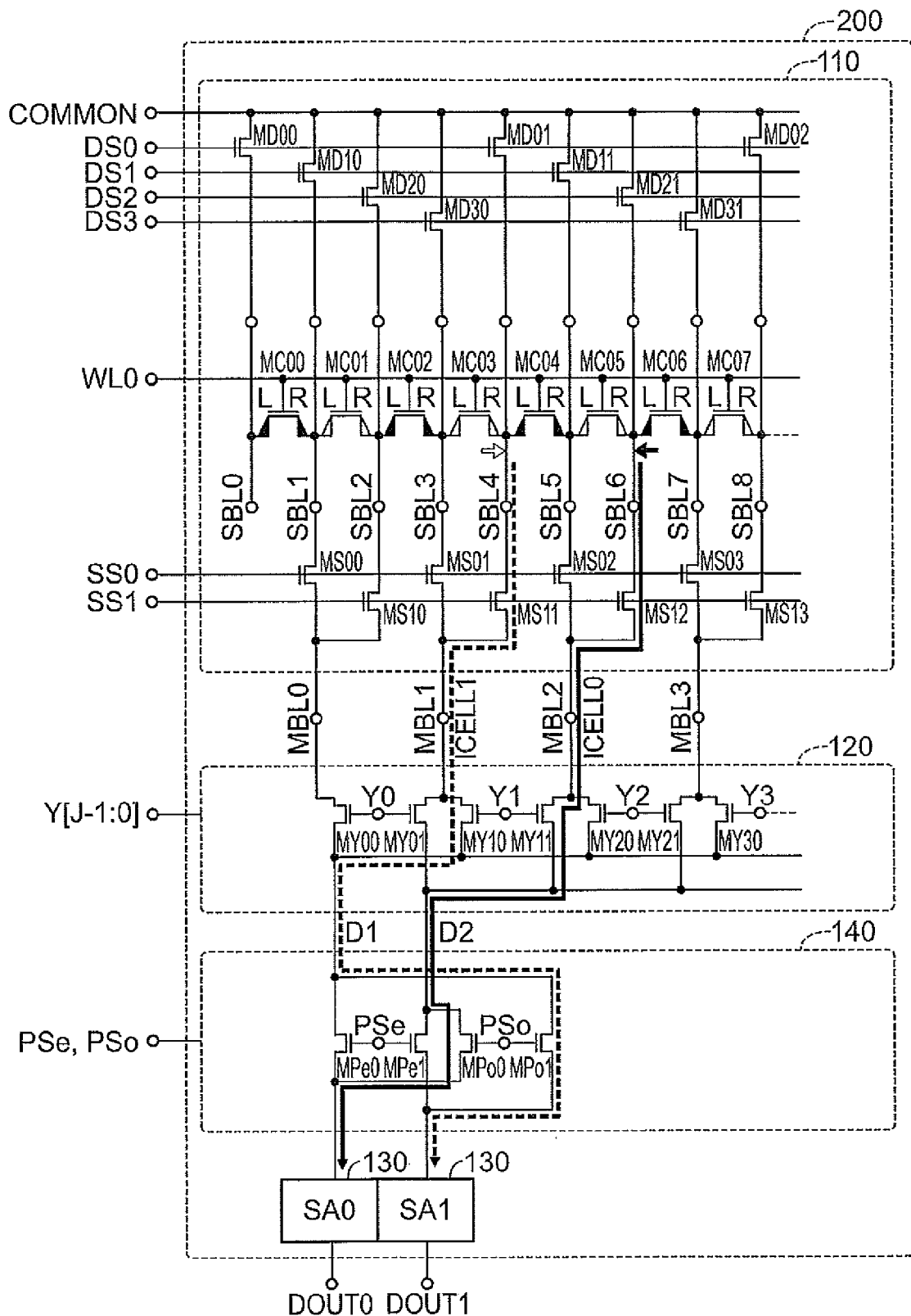
FIG. 8 is a diagram showing an operation of the semiconductor storage circuit according to the second exemplary embodiment.

FIG. 7 and FIG. 8 show a data read operation of the semiconductor storage circuit 200. However, FIG. 7 and FIG. 8 show only one of the M memory cell arrays 110 and one word line WL0 of N word lines. The operation of the semiconductor storage circuit 200 will be described using FIG. 7 and FIG. 8.

Referring to FIG. 7, a case where MC00_R and MC03_L are selected will be described.

By selecting WL0 by the memory cell array 110, all of the memory cells including MC00 and MC03 in which a gate terminal thereof is connect to WL0 enter in a conductive state. By selecting DS0, MD00 and MD01 enter in a conductive state. Then, COMMON is connected to diffusion layers of the MC00_L side and the MC03_R side through SBL0 and SBL4.

By selecting SS0, MS00 and MS01 enter in a conductive state. Then, MBL0 and MBL1 are connected to the diffusion layers of the MC00_R side and the MC03_L side through SBL1 and SBL3.

By selecting Y0, MY00 and MY01 of the multiplexer 120 enter in a conductive state. Then, by selecting PSe, MPe0 and MPe1 of the SA selecting circuit 140 enter in a conductive state. Accordingly, MBL0 and MBL1 are connected to the sense amplifier SA0 and the sense amplifier SA1 through a first data output line D1 and a second data output line D2. Thereby, MC00_R and MC03_L are selected, and currents ICELL0 and ICELL1 flow into the sense amplifier SA0 and the sense amplifier SA1, respectively. The sense amplifier SA0 and the sense amplifier SA1 output logical levels, which are determined on the basis of the currents ICELL0 and ICELL1, to DOUT0 and DOUT1, respectively.

Referring to FIG. 8, a case where MC03_R and MC06_L are selected will be described.

By selecting WL0 by the memory cell array 110, all of the memory cells including MC03 and MC06 in which the gate terminal thereof is connected to WL0 enter in a conductive state. By selecting DS3, MD30 and MD31 enter in a conductive state. Then, COMMON is connected to the diffusion layers of the MC03_L side and the MC06_R side through SBL3 and SBL7.

By selecting SS1, MS11 and MS12 enter in a conductive state. Then, MBL1 and MBL2 are connected to the diffusion layers of the MC03_R side and the MC06_L side through SBL4 and SBL6. By selecting Y1, MY10 and MY11 of the multiplexer 120 enter in a conductive state. Then, by PSo, MPo0 and MPo1 of the SA selecting circuit 140 enter in a conductive state. Accordingly, MBL1 and MBL2 are connected to the sense amplifier SA1 and the sense amplifier SA0 through the first data output line D1 and the second data output line D2. Thereby, MC03_R and MC06_L are selected. As a result, the currents ICELL1 and ICELL0 flow into the sense amplifier SA1 and the sense amplifier SA0, respectively. The sense amplifier SA0 and the sense amplifier SA1 output logical levels, which are determined on the basis of the currents ICELL0 and ICELL1, to DOUT0 and DOUT1, respectively.

Here, in the SA selecting circuit 140, when the semiconductor storage circuit 200 selects the even-numbered SS, the SA selecting circuit 140 connects the memory cell using the R-side to the sense amplifier SA0, and connects the memory cell using the L side to the sense amplifier SA1. Namely, the semiconductor storage circuit 200 selects PSe. Meanwhile, when the semiconductor storage circuit 200 selects the odd-numbered SS, the SA selecting circuit 140 connects the memory cell using the R side to the sense amplifier SA1, and connects the memory cell using the L side to the sense amplifier SA0. Namely, the semiconductor storage circuit 200 selects PSo.

When the semiconductor storage circuit 200 selects the $(2\alpha+\beta)$-th SS ($\alpha$ is 0, 1, 2, . . . , and M−1 and $\beta$=0, 1) and the even-numbered Y, the semiconductor storage circuit 200 selects the $((2\alpha+0)\times2+\beta)$-th DS. When the semiconductor storage circuit 200 selects the odd-numbered Y, the semiconductor storage circuit 200 selects the $((2\alpha+1)\times2+\beta)$-th DS.

Therefore, the semiconductor storage circuit 200 according to the second exemplary embodiment may balance out the influence of the characteristic change of the sense amplifier, as the semiconductor storage circuit 100 of the first exemplary embodiment. Since this effect of the second exemplary embodiment is the same as that of the semiconductor storage circuit 100, the description thereof is omitted.

Further, since the circuit scale of the SA selecting circuit 140 is smaller than that of the multiplexer 120, the semiconductor storage circuit 200 according to this exemplary embodiment may decrease the circuit scale.

Third Exemplary Embodiment

Next, the third exemplary embodiment of the present invention will be described. The same components as those of the above-described semiconductor storage circuit are denoted by the same reference numerals and the description thereof is omitted.

Figure 9:
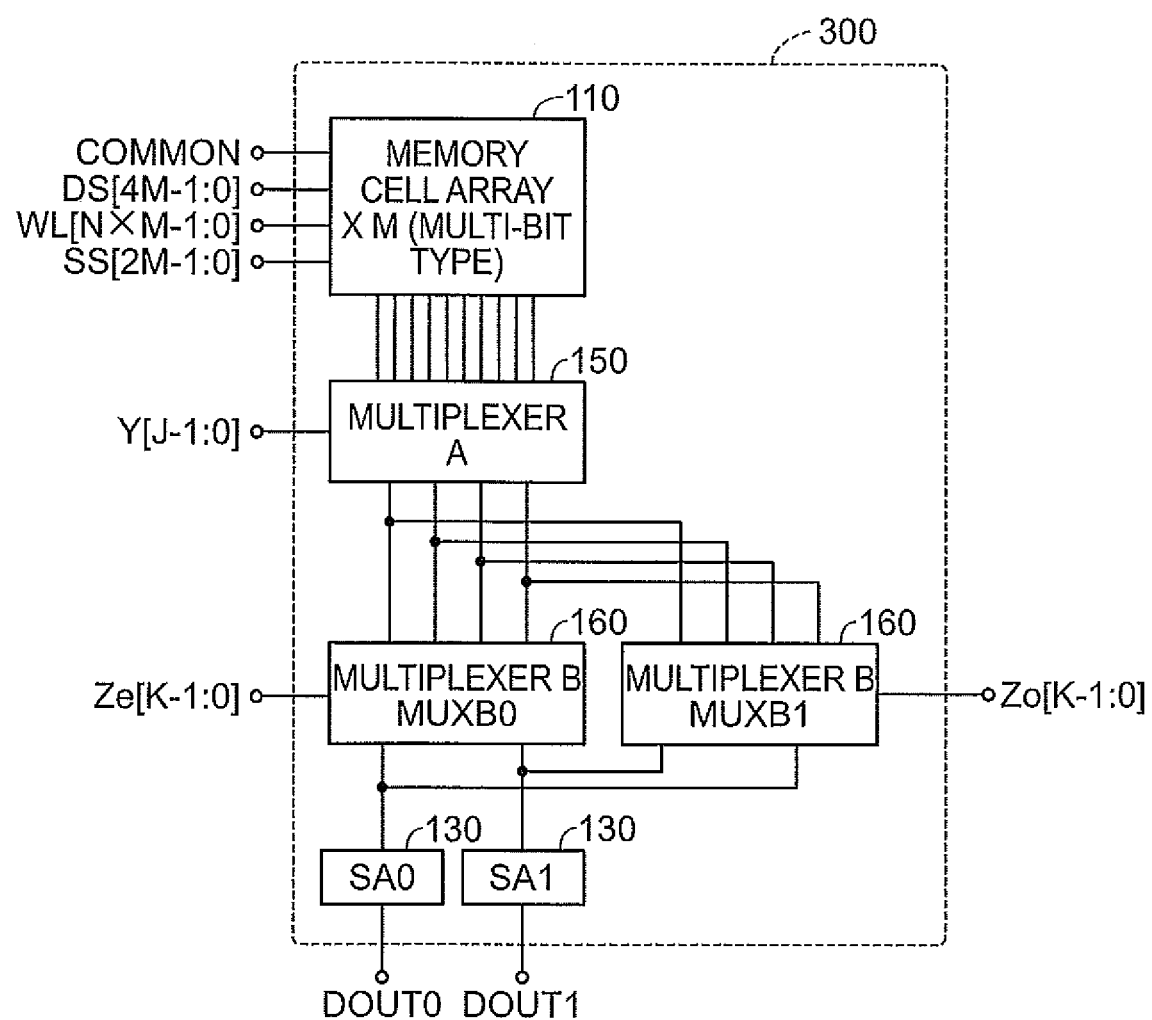
FIG. 9 is a block diagram showing the schematic configuration of a semiconductor storage circuit according to a third exemplary embodiment.
Figure 10:
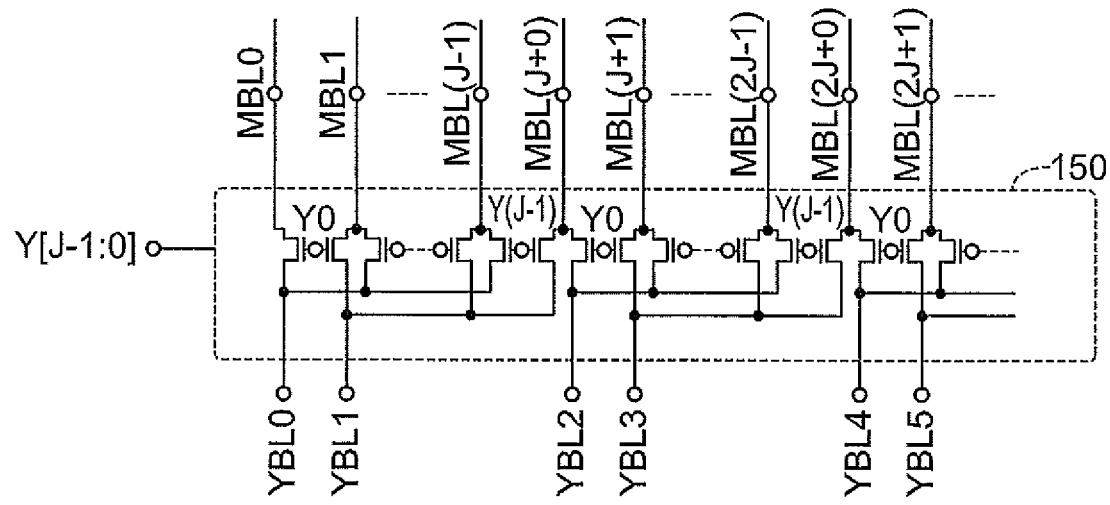
FIG. 10 is a circuit diagram of a multiplexer according to a third exemplary embodiment.
Figure 11:
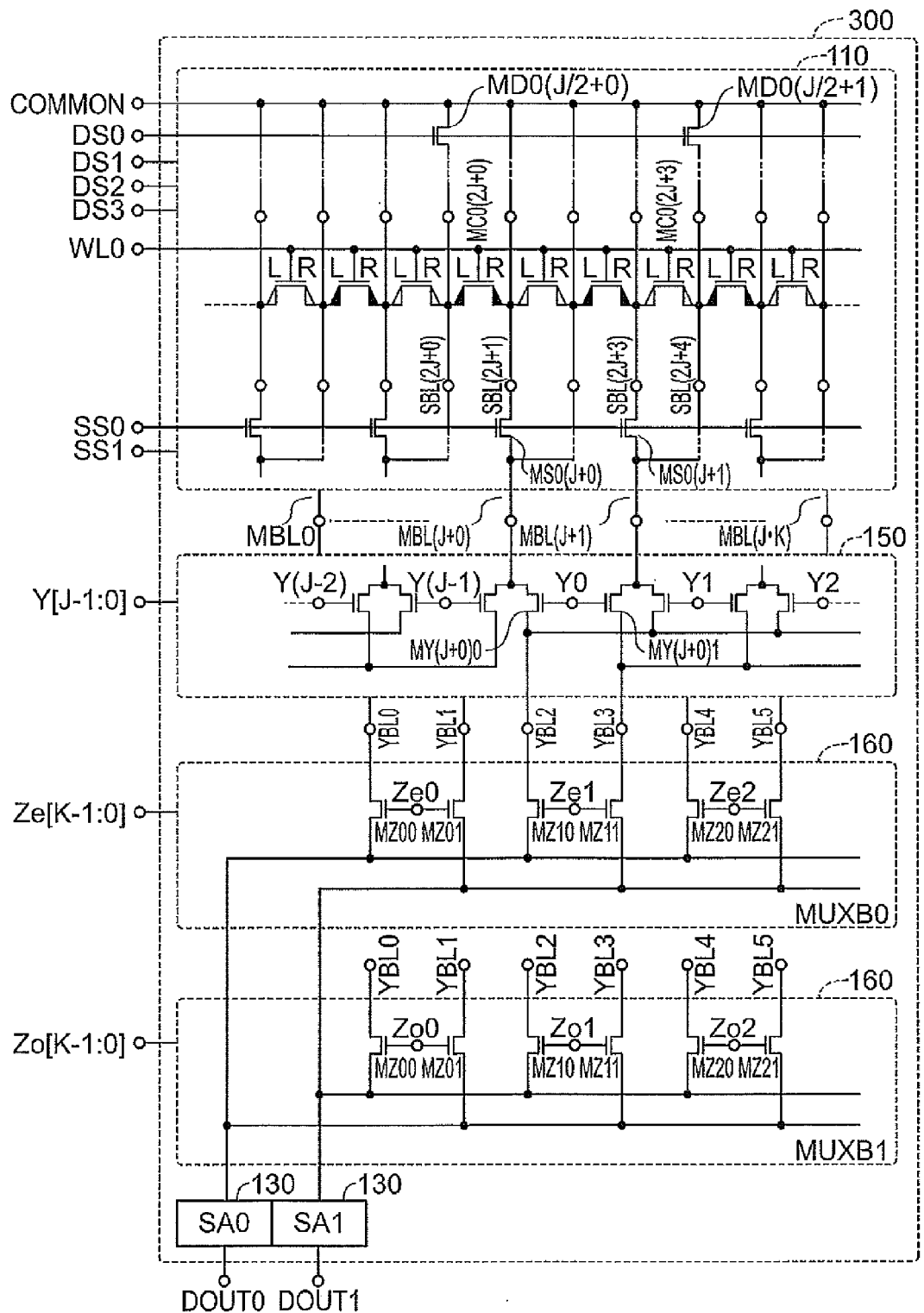
FIG. 11 is a circuit diagram of the semiconductor storage circuit according to the third exemplary embodiment.

FIG. 9 is a block diagram showing the schematic configuration of a semiconductor storage circuit 300 according to the third exemplary embodiment of the present invention. FIG. 10 is a circuit diagram of a multiplexer A150 of the semiconductor storage circuit 300. FIG. 11 is a circuit diagram of a memory cell array 110, a multiplexer A150, and a multiplexer B160 of the semiconductor storage circuit 300.

As shown in FIG. 9 and FIG. 11, in the semiconductor storage circuit 300, the multiplexers are configured in multi-steps. The semiconductor storage circuit 300 is configured to include the memory cell array 110, the multiplexer A150, the multiplexer B160, and the sense amplifier 130.

The multiplexer B160 includes two multiplexers MUXB0 and MUXB1. The sense amplifier 130 includes two sense amplifiers SA0 and SA1. MBL [J·K:0] is a main bit line. The M memory cell arrays 110 are connected to MBL [J·K:0]. However, FIG. 11 shows only one of the M memory cell arrays 110.

YBL [2K−1:0] is a bit line that is connected to the multiplexers MUXB0 and MUXB1 from the multiplexer A150. However, FIG. 10 and FIG. 11 show only YBL [5:0]. Ze [K−1:0] and Zo [K−1:0] are signals to select the main bit lines connected to the sense amplifiers.

Note that "K" denotes the number of signal line of Ze and Zo that selects the main bit lines. In this case, a transistor where "MZ" is added as prefix is a transistor to select the main bit line connected to the sense amplifier, and a gate terminal thereof receives the main bit line selection signal Ze or Zo. Since the other configuration is the same as that of the semiconductor storage circuit 1000, the description thereof is omitted.

Figure 12:
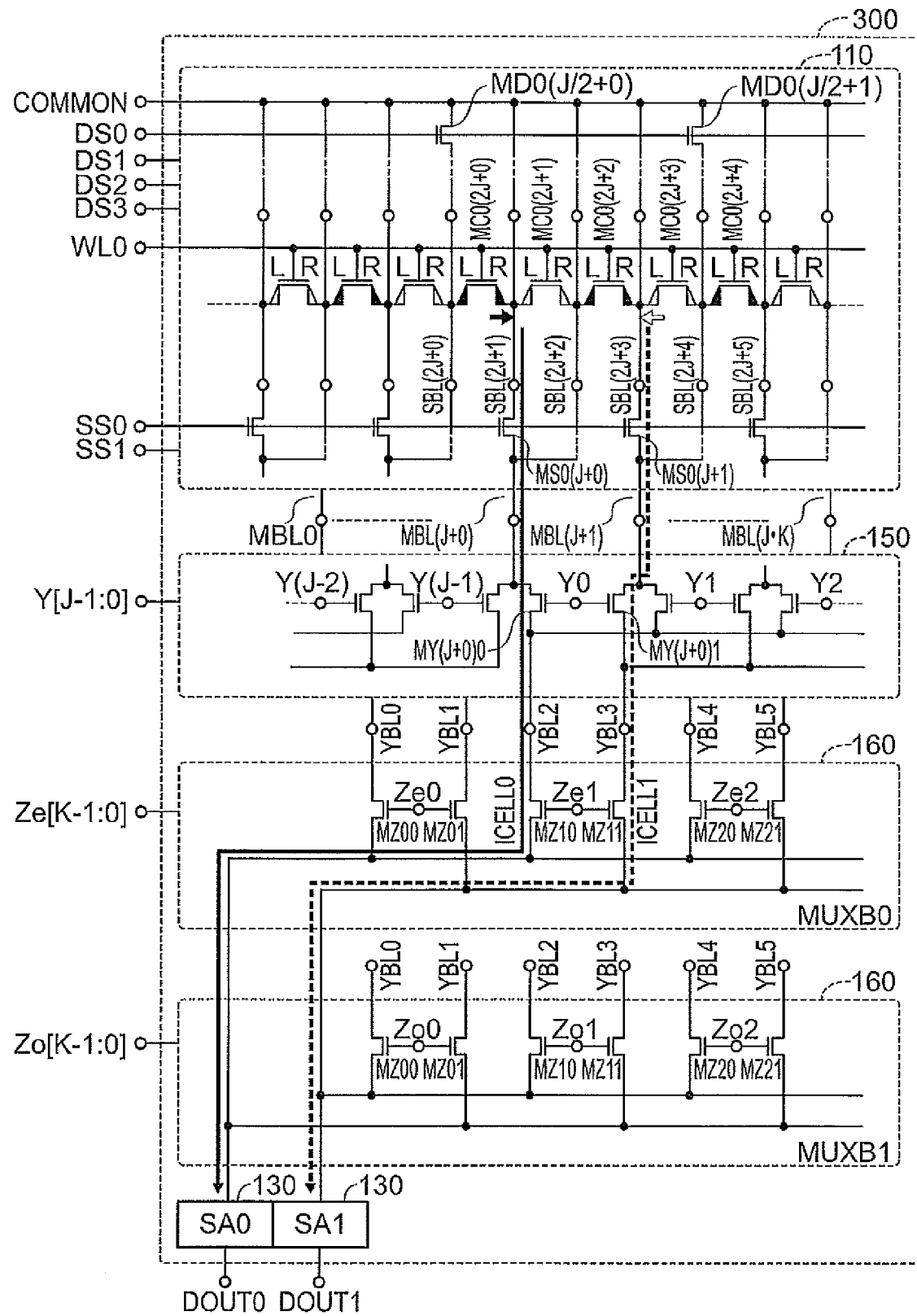
FIG. 12 is a diagram showing an operation of the semiconductor storage circuit according to the third exemplary embodiment.
Figure 13:
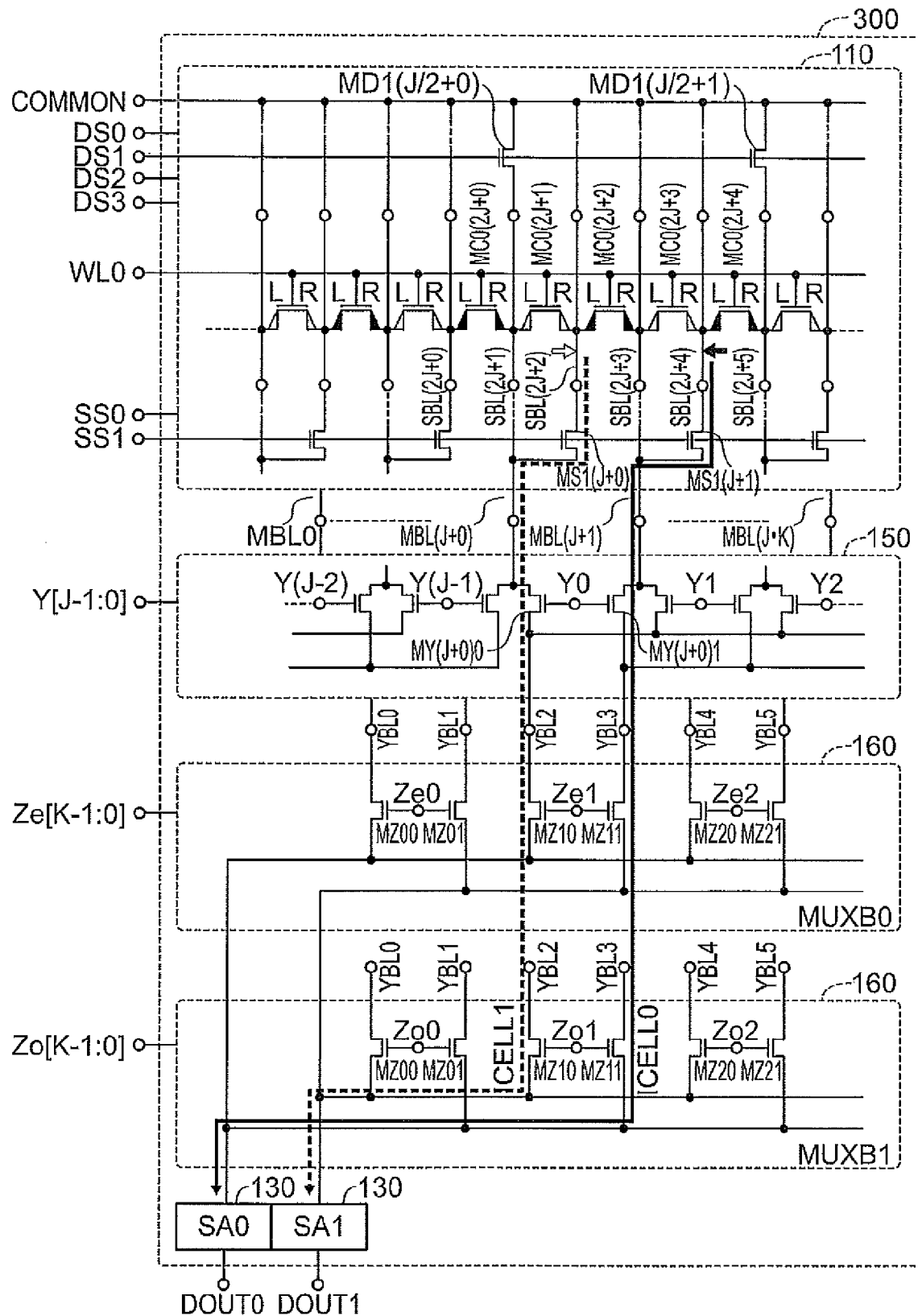
FIG. 13 is a diagram showing an operation of the semiconductor storage circuit according to the third exemplary embodiment.

FIG. 12 and FIG. 13 show a data read operation of the semiconductor storage circuit 300. However, FIG. 12 and FIG. 13 show only one of the M memory cell arrays 110 and one word line WL0 of N word lines. In this case, only the selected signal lines are shown as DS and SS, and only YBL [5:0] is shown as YBL. The operation of the semiconductor storage circuit 300 will be described using FIG. 12 and FIG. 13.

Referring to FIG. 12, a case where MC0 (2J+0)_R and MC0 (2J+3)_L are selected will be described.

By selecting WL0 by the memory cell array 110, all of the memory cells including MC0 (2J+0) and MC0 (2J+3) in which a gate terminal is connected to WL0 enter in a conductive state. By selecting DS0, MD0 (J/2+0) and MD0 (J/2+1) enter in a conductive state. Then, COMMON is connected to diffusion layers of the MC0 (2J+0)_L side and the MC0 (2J+3)_R side through SBL (2J+0) and SBL (2J+4).

By selecting SS0, MS0 (J+0) and MS0 (J+1) enter in a conductive state. Then, MBL (J+0) and MBL (J+1) are connected to the diffusion layers of the MC0 (2J+0)_R side and the MC0 (2J+3)_L side through SBL (2J+1) and SBL (2J+3). By selecting Y0, MY (J+0) 0 and MY (J+0) 1 of the multiplexer A150 enter in a conductive state. Then, by selecting Ze1, MZ10 and MZ11 of the multiplexer MUXB0 enter in a conductive state. For this reason, MBL (J+0) and MBL (J+1) are connected to the sense amplifier SA0 and the sense amplifier SA1.

Thereby, MC0 (2J+0)_R and MC0 (2J+3)_L are selected, and currents ICELL0 and ICELL1 flow into the sense amplifier SA0 and the sense amplifier SA1, respectively. The sense amplifier SA0 and the sense amplifier SA1 output logical levels, which are determined on the basis of the currents ICELL0 and ICELL1, to DOUT0 and DOUT1, respectively.

Referring to FIG. 13, a case where MC0 (2J+1)_R and MC0 (2J+4)_L are selected will be described.

By selecting WL0 by the memory cell array 110, all of the memory cells including MC0 (2J+1) and MC0 (2J+4) in which the gate terminal is connect to WL0 enter in a conductive state. By selecting DS1, MD1 (J/2+0) and MD1 (J/2+1) enter in a conductive state. Then, COMMON is connected to diffusion layers of the MC0 (2J+1)_L side and the MC0 (2J+4)_R side through SBL (2J+1) and SBL (2J+5).

By selecting SS1, MS1 (J+0) and MS1 (J+1) enter in a conductive state. Then, MBL (J+0) and MBL (J+1) are connected to the diffusion layers of the MC0 (2J+1)_R side and the MC0 (2J+4)_L side through SBL (2J+2) and SBL (2J+4). By selecting Y0, MY (J+0) 0 and MY (J+0) 1 of the multiplexer A150 enter in a conductive state. Then, by selecting Zo1, MZ10 and MZ11 of the multiplexer MUXB1 enter in a conductive state. For this reason, MBL (J+0) and MBL (J+1) are connected to the sense amplifier SA1 and the sense amplifier SA0, respectively.

Thereby, MC0 (2J+4)_L and MC0 (2J+1)_R are selected, and currents ICELL1 and ICELL0 flow into the sense amplifier SA1 and the sense amplifier SA0, respectively. The sense amplifier SA0 and the sense amplifier SA1 output logical levels, which are determined on the basis of the currents ICELL0 and ICELL1, to DOUT0 and DOUT1, respectively.

Here, in the multiplexers MUXB0 and MUXB1, when the semiconductor storage circuit 300 selects the even-numbered SS, the multiplexers MUXB0 and MUXB1 connect the memory cell using the R-side to the sense amplifier SA0, and connect the memory cell using the L side to the sense amplifier SA1. Namely, semiconductor storage circuit 300 selects Ze. Meanwhile, when the semiconductor storage circuit 300 selects the odd-numbered SS, the multiplexers MUXB0 and MUXB1 connect the memory cell using the R side to the sense amplifier AS1, and connect the memory cell using the L side to the sense amplifier SA0. Namely, semiconductor storage circuit 300 selects Zo.

When the semiconductor storage circuit 300 selects the $(2\alpha+\beta)$-th SS ($\alpha$ is 0, 1, 2, ..., and M−1 and $\beta$=0, 1) and the even-numbered Y, the semiconductor storage circuit 300 selects the $((2\alpha+0)\times2+\beta)$-th DS. When the semiconductor storage circuit 300 selects the odd-numbered Y, the semiconductor storage circuit 300 selects the $((2\alpha+1)\times2+\beta)$-th DS.

Therefore, the semiconductor storage circuit 300 according to the third exemplary embodiment may balance out the influence of the characteristic change of the sense amplifier, similar to the semiconductor storage circuit 100, even when the multiplexers are configured in the multi-steps. Since this effect of the third exemplary embodiment is the same as that of the semiconductor storage circuit 100, the description thereof is omitted.

Fourth Exemplary Embodiment

Next, the fourth exemplary embodiment of the present invention will be described. The same components as those of the above-described semiconductor storage circuit are denoted by the same reference numerals and the description thereof is omitted.

Figure 14:
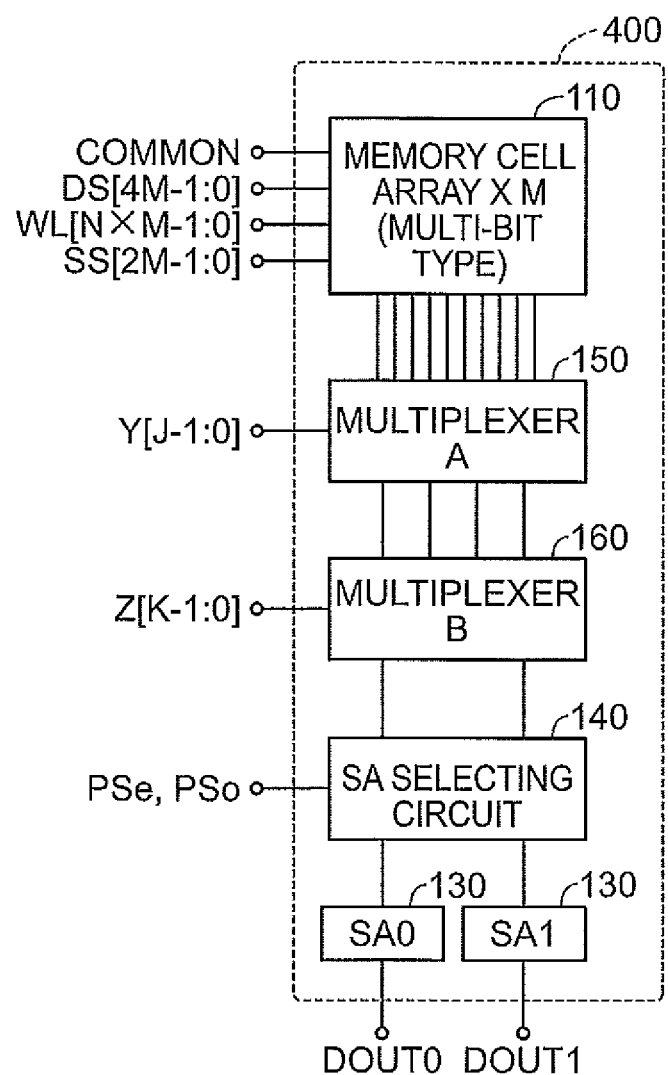
FIG. 14 is a block diagram showing the schematic configuration of a semiconductor storage circuit according to a fourth exemplary embodiment.
Figure 15:
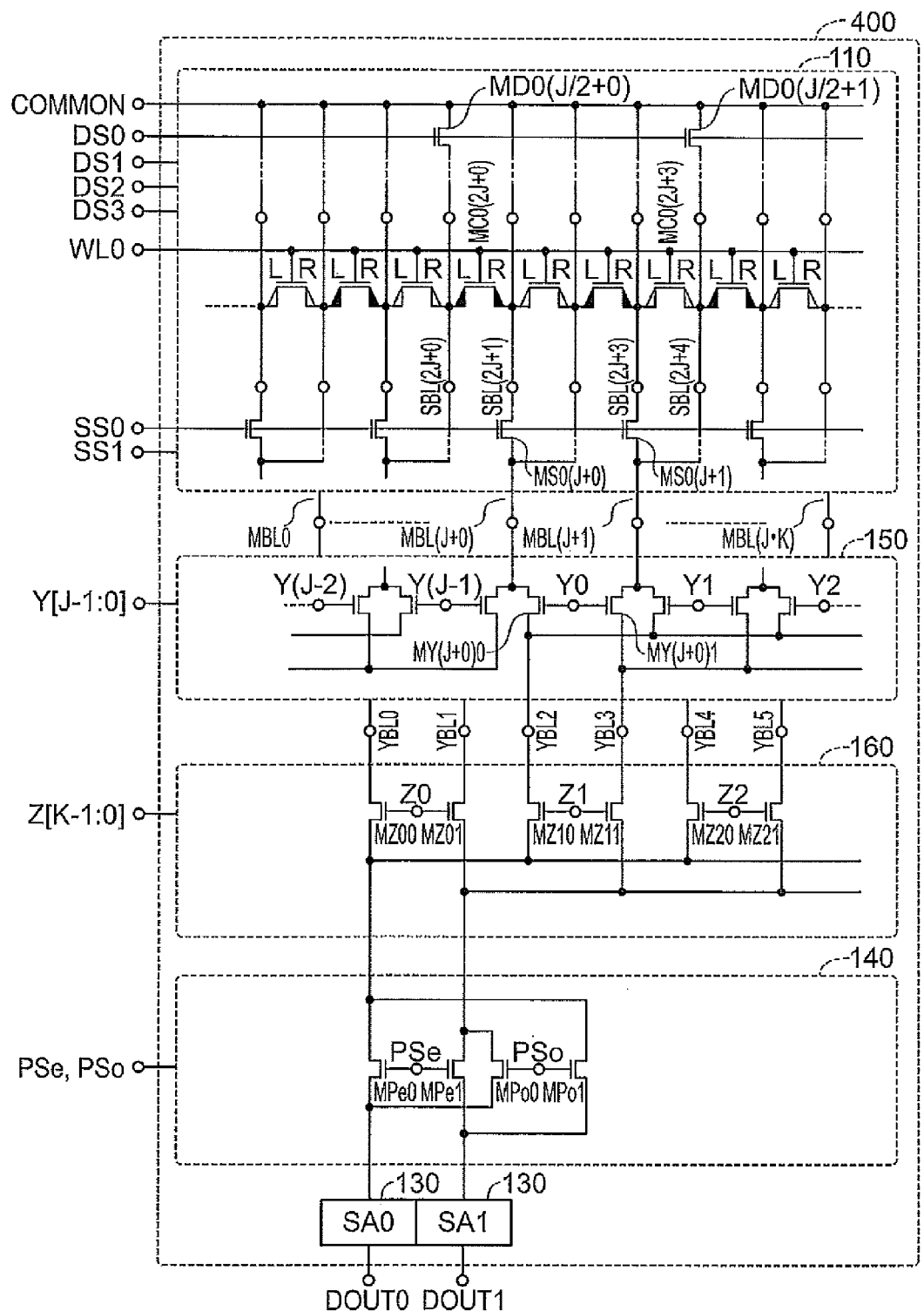
FIG. 15 is a circuit diagram of the semiconductor storage circuit according to the fourth exemplary embodiment.

FIG. 14 is a block diagram showing the schematic configuration of a semiconductor storage circuit 400 according to the fourth exemplary embodiment of the present invention. FIG. 15 is a circuit diagram of a memory cell array 110, a multiplexer A150, a multiplexer B160, and a SA selecting circuit 140 of the semiconductor storage circuit 400.

As shown in FIG. 14 and FIG. 15, in the semiconductor storage circuit 400, the multiplexers are configured in multi-steps. The semiconductor storage circuit 400 is configured to include is configured to include the memory cell array 110, the multiplexer A150, the multiplexer B160, the SA selecting circuit 140, and the sense amplifier 130.

The sense amplifier 130 includes two sense amplifiers SA0 and SA1. MBL [J·K:0] is a main bit line. The M memory cell arrays 110 are connected to MBL [J·K:0]. However, FIG. 15 shows only one of the M memory cell arrays 110.

YBL [2K−1:0] is a bit line that is connected to the multiplexer B160 from the multiplexer A150. However, FIG. 15 shows only YBL [5:0]. Z [K−1:0] and Pse and Pso are signals to select the main bit lines connected to the sense amplifiers. Note that "K" denotes the number of signal lines of Z that selects the main bit lines. In this case, a transistor where "MZ" is added as prefix is a transistor to select the main bit line connected to the sense amplifier, and a gate terminal thereof receives the main bit line selection signal Z. A transistor where "MP" is added as prefix is a transistor used to select the main bit line connected to the sense amplifier, and a gate terminal thereof receives the main bit line selection signal PSe or PSo. Since the other configuration is the same as that of the semiconductor storage circuit 1000, the description thereof is omitted.

Figure 16:
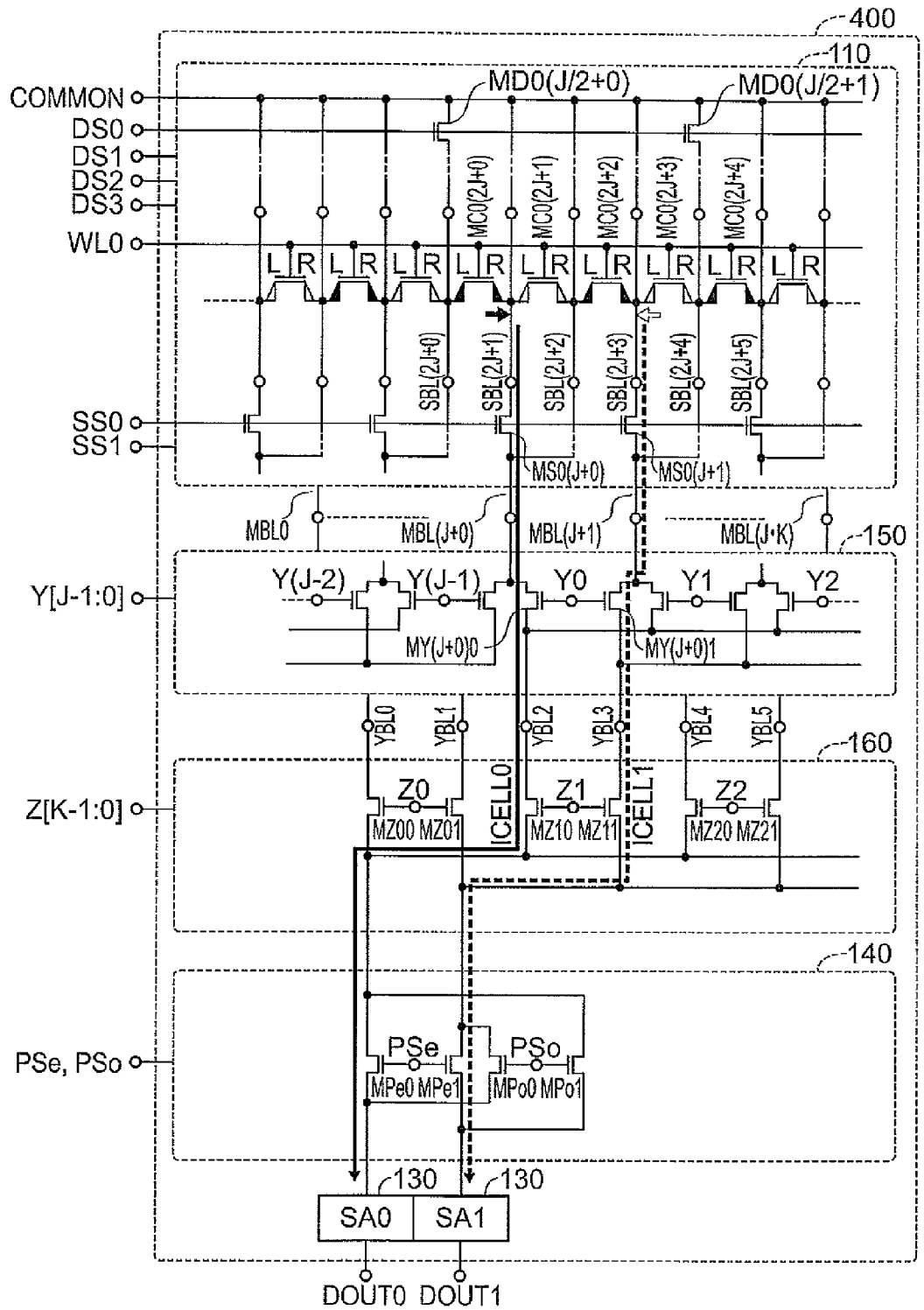
FIG. 16 is a diagram showing an operation of the semiconductor storage circuit according to the fourth exemplary embodiment.
Figure 17:
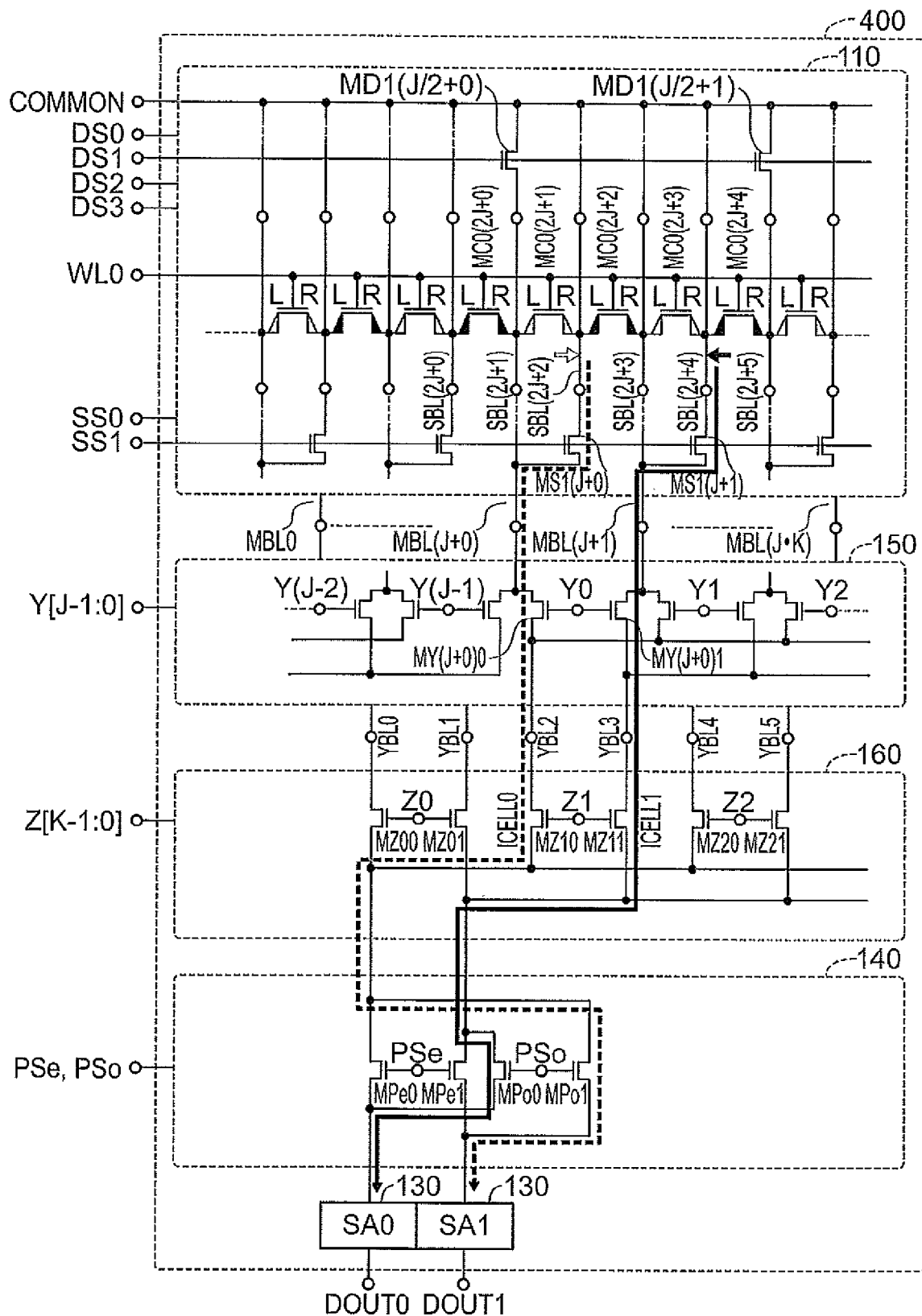
FIG. 17 is a diagram showing an operation of the semiconductor storage circuit according to the fourth exemplary embodiment.

FIG. 16 and FIG. 17 show a data read operation of the semiconductor storage circuit 400. However, FIG. 16 and FIG. 17 show only one of the M memory cell arrays 110 and one word line WL0 of N word lines. In this case, only the selected signal lines are shown as DS and SS and only YBL [5:0] is shown as YBL. The operation of the semiconductor storage circuit 400 will be described using FIG. 16 and FIG. 17.

Referring to FIG. 16, a case where MC0 (2J+0)_R and MC0 (2J+3)_L are selected will be described.

By selecting WL0 by the memory cell array 110, all of the memory cells including MC0 (2J+0) and MC0 (2J+3) in which a gate terminal is connect to WL0 enter in a conductive state. By selecting DS0, MD0 (J/2+0) and MD0 (J/2+1) enter in a conductive state. Then, COMMON is connected to diffusion layers of the MC0 (2J+0)_L side and the MC0 (2J+3)_R side through SBL (2J+0) and SBL (2J+4).

By selecting SS0, MS0 (J+0) and MS0 (J+1) enter in a conductive state. Then, MBL (J+0) and MBL (J+1) are connected to the diffusion layers of the MC0 (2J+0)_R side and the MC0 (2J+3)_L side through SBL (2J+1) and SBL (2J+3). By selecting Y0, MY (J+0) 0 and MY (J+0) 1 of the multiplexer A150 enter in a conductive state. Then, by selecting Z1, MZ10 and MZ11 of the multiplexer B160 enter in a conductive state. By selecting PSe, MPe0 and MPe1 of the SA selecting circuit 140 enter in a conductive state. For this reason, MBL (J+0) and MBL (J+1) are connected to the sense amplifier SA0 and the sense amplifier SA1, respectively.

Thereby, MC0 (2J+0)_R and MC0 (2J+3)_L are selected, and currents ICELL0 and ICELL1 flow into the sense amplifier SA0 and the sense amplifier SA1, respectively. The sense amplifier SA0 and the sense amplifier SA1 output logical levels, which are determined on the basis of the currents ICELL0 and ICELL1, to DOUT0 and DOUT1, respectively.

Referring to FIG. 17, a case where MC0 (2J+1)_R and MC0 (2J+4)_L are selected will be described.

By selecting WL0 by the memory cell array 110, all of the memory cells including MC0 (2J+1) and MC0 (2J+4) in which a gate terminal is connect to WL0 enter in a conductive state. By selecting DS1, MD1 (J/2+0) and MD1 (J/2+1) enter in a conductive state. Then, COMMON is connected to diffusion layers of the MC0 (2J+1)_L side and the MC0 (2J+4)_R side through SBL (2J+1) and SBL (2J+5).

By selecting SS1, MS1 (J+0) and MS1 (J+1) enter in a conductive state. Then, MBL (J+0) and MBL (J+1) are connected to the diffusion layers of the MC0 (2J+1)_R side and the MC0 (2J+4)_L side through SBL (2J+2) and SBL (2J+4). By selecting Y0, MY (J+0) 0 and MY (J+0) 1 of the multiplexer A150 enter in a conductive state. Then, by selecting Z1, MZ10 and MZ11 of the multiplexer B160 enter in a conductive state. By selecting PSo, MPo0 and MPo1 of the SA selecting circuit 140 enter in a conductive state. For this reason, MBL (J+0) and MBL (J+1) are connected to the sense amplifier SA1 and the sense amplifier SA0, respectively.

Thereby, MC0 (2J+4)_L and MC0 (2J+1)_R are selected, and currents ICELL1 and ICELL0 flow into the sense amplifier SA1 and the sense amplifier SA0, respectively. The sense amplifier SA0 and the sense amplifier SA1 output logical levels, which are determined on the basis of the currents ICELL0 and ICELL1, to DOUT0 and DOUT1, respectively.

In this case, in the SA selecting circuit 140, when the semiconductor storage circuit 400 selects the even-numbered SS, the SA selecting circuit 140 connects the memory cell using the R-side to the sense amplifier SA0, and connects the memory cell using the L side to the sense amplifier SA1. Namely, the semiconductor storage circuit 400 selects PSe. Meanwhile, when the semiconductor storage circuit 400 selects the odd-numbered SS, the SA selecting circuit 140 connects the memory cell using the R side to the sense amplifier SA1 and connects the memory cell using the L side to the sense amplifier SA0. Namely, the semiconductor storage circuit 400 selects PSo. When the semiconductor storage circuit 400 selects the $(2\alpha+\beta)$-th SS ($\alpha$ is 0, 1, 2, ..., and M−1 and $\beta=0, 1$) and the even-numbered Y, the semiconductor storage circuit 400 selects the $((2\alpha+0)\times 2+\beta)$-th DS. When the semiconductor storage circuit 400 selects the odd-numbered Y, the semiconductor storage circuit 400 selects the $((2\alpha+1)\times 2+\beta)$-th DS.

Therefore, the semiconductor storage circuit 400 according to the fourth exemplary embodiment may balance out the influence of the characteristic change of the sense amplifier, similar to the semiconductor storage circuit 300. Since this effect of the fourth exemplary embodiment is the same as that of the semiconductor storage circuit 100, the description thereof is omitted.

Since the circuit scale of the SA selecting circuit 140 is smaller than that of the multiplexer B160, the semiconductor storage circuit 400 according to this exemplary embodiment may decrease the circuit scale as compared with the semiconductor storage circuit 300.

Fifth Exemplary Embodiment

Next, the fifth exemplary embodiment of the present invention will be described. The same components as those of the above-described semiconductor storage circuit are denoted by the same reference numerals and the detailed description thereof is omitted.

Figure 18:
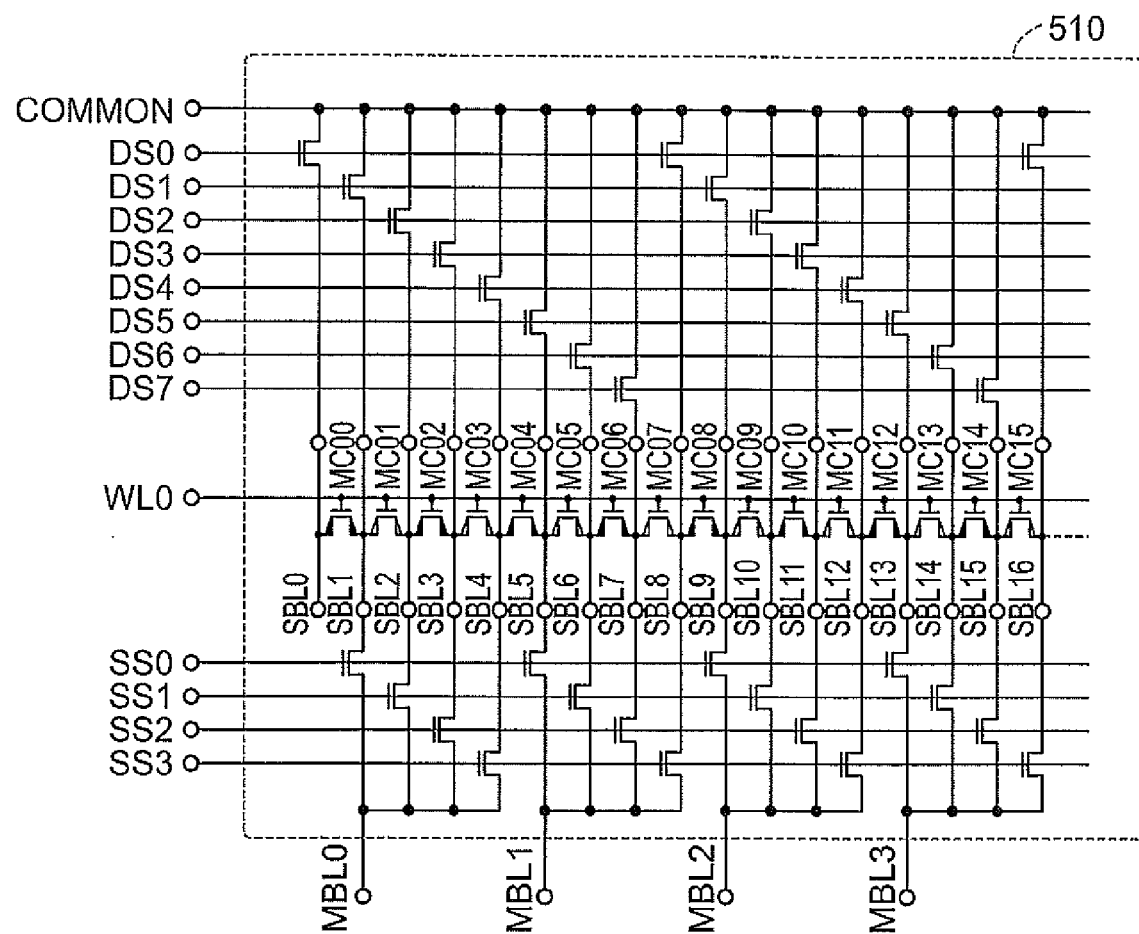
FIG. 18 is a circuit diagram of a memory cell array of a semiconductor storage circuit according to a fifth exemplary embodiment.

FIG. 18 is a circuit diagram of a memory cell array 510 according to the fifth exemplary embodiment of the present invention. DS [7:0] is a signal to select a sub-bit line connected to COMMON. SS [3:0] is a signal to select a sub-bit line connected to a main bit line. The sub-bit lines and the main bit lines are shown until SBL [16:0] and MBL [3:0], respectively. Since the other configuration is the same as that of the memory cell array 110, the description thereof is omitted.

The memory cell array 510 may be used, instead of the memory cell array 110 according to the first to fourth exemplary embodiments. Since a method of selecting a path from the main bit line to the sense amplifier is the same as those of the first to fourth exemplary embodiments, the description thereof is omitted.

Figure 19:
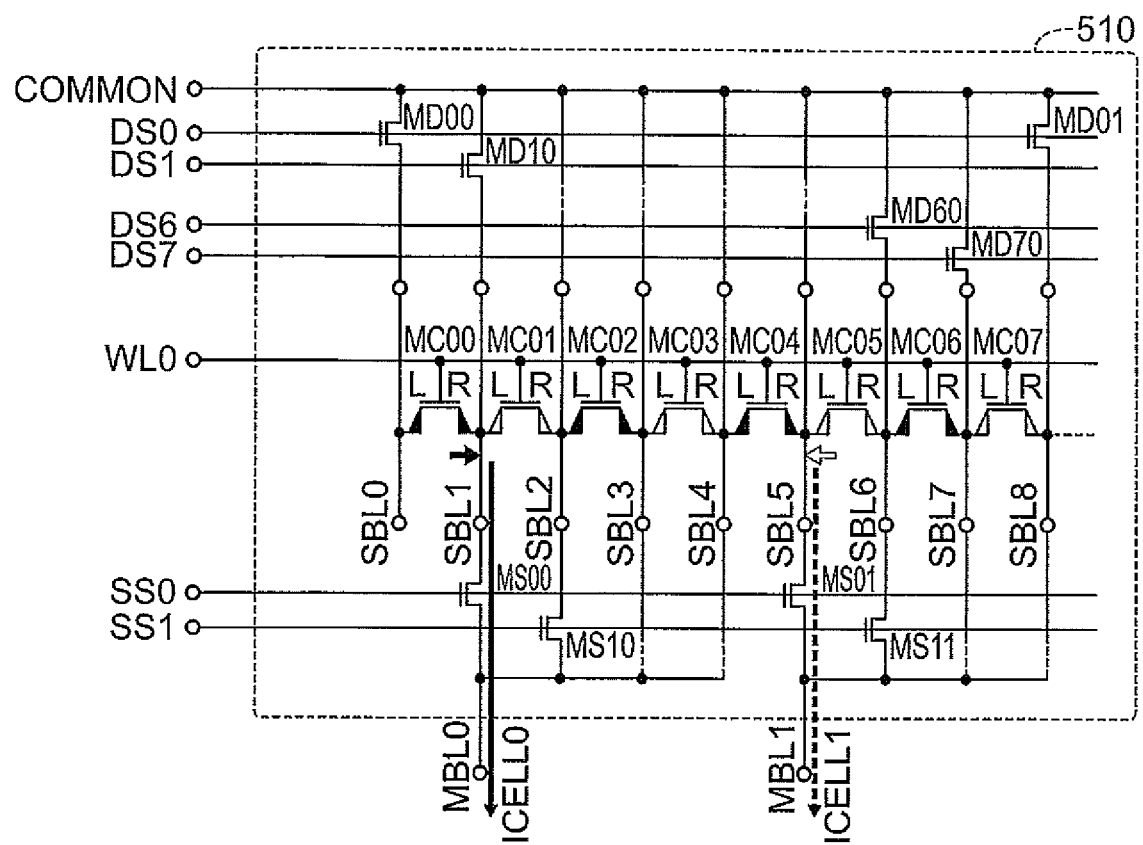
FIG. 19 is a diagram showing an operation of the semiconductor storage circuit according to the fifth exemplary embodiment.
Figure 20:
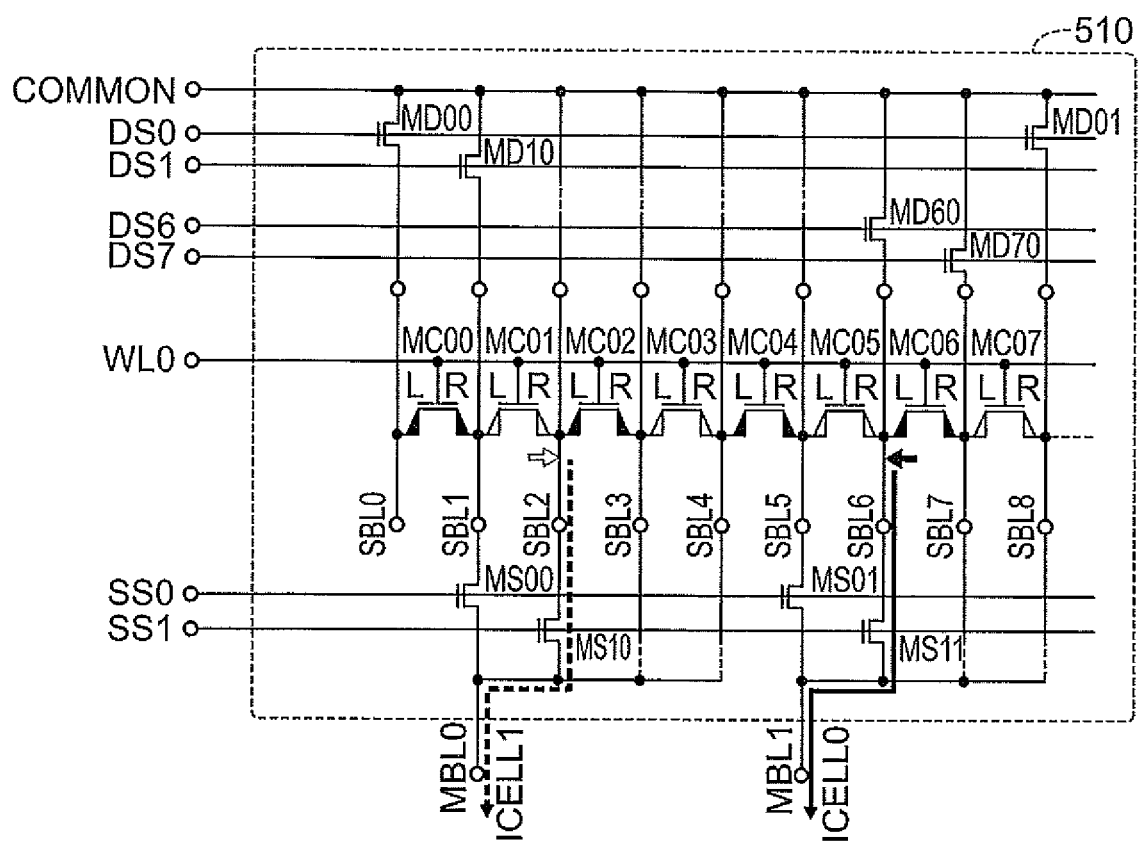
FIG. 20 is a diagram showing an operation of the semiconductor storage circuit according to the fifth exemplary embodiment.
Figure 21:
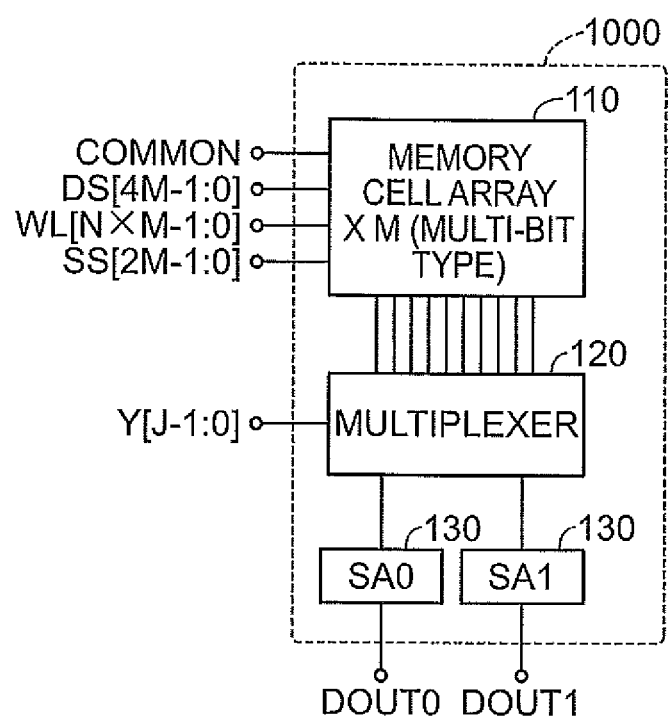
FIG. 21 is a block diagram showing the schematic configuration of a conventional semiconductor storage circuit.
Figure 22:
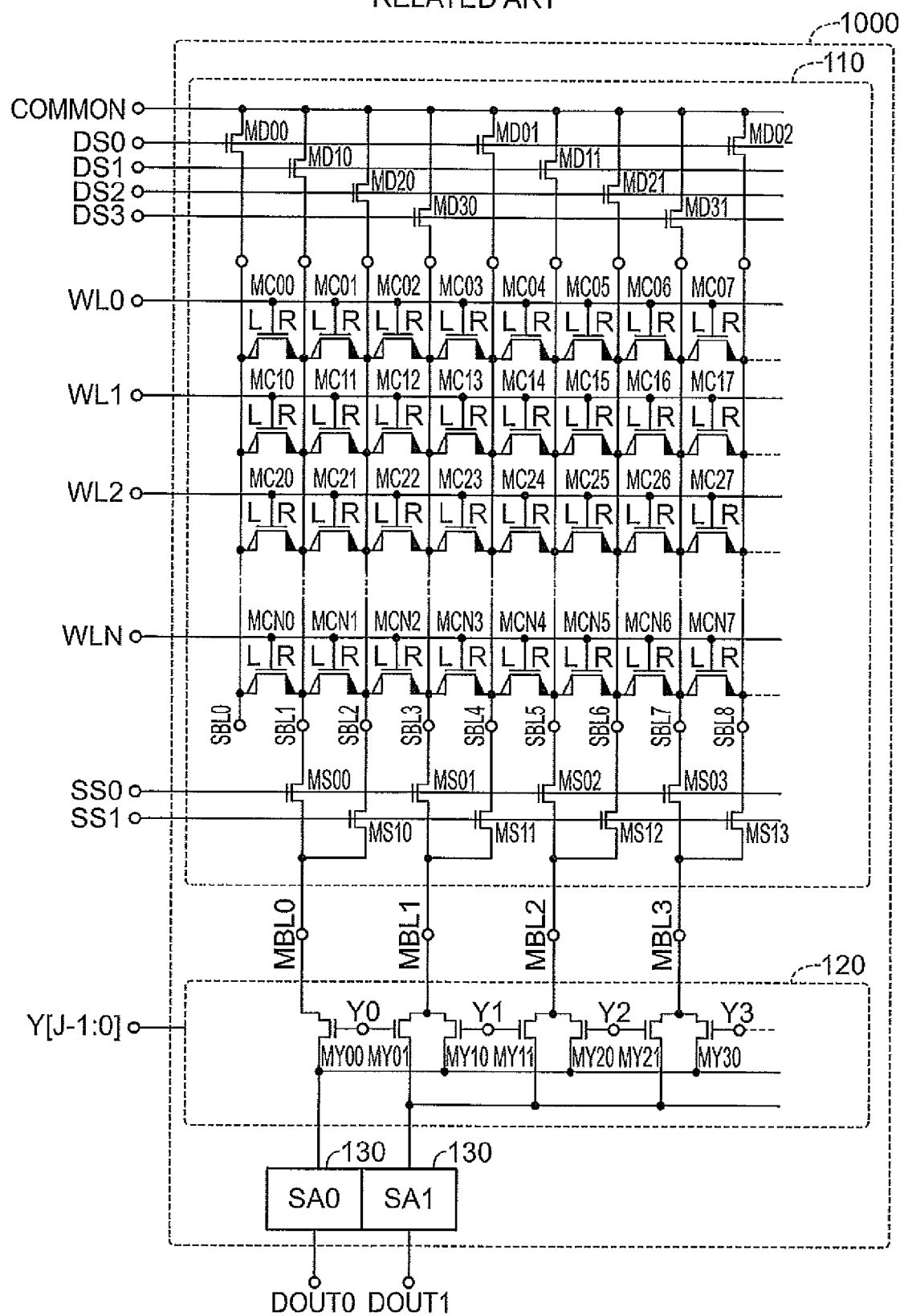
FIG. 22 is a circuit diagram of the conventional semiconductor storage circuit.
Figure 23:
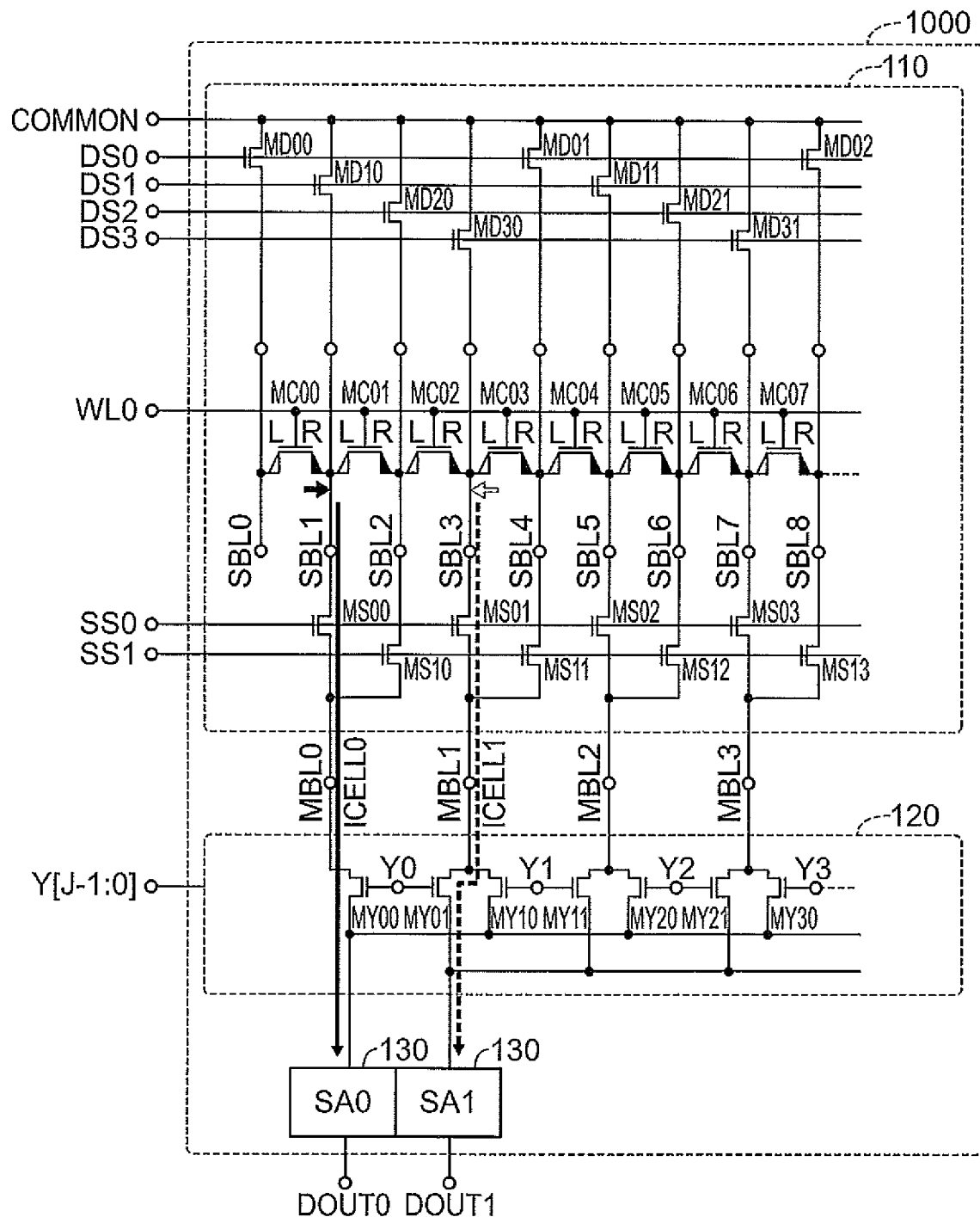
FIG. 23 is a diagram showing an operation of the conventional semiconductor storage circuit.
Figure 24:
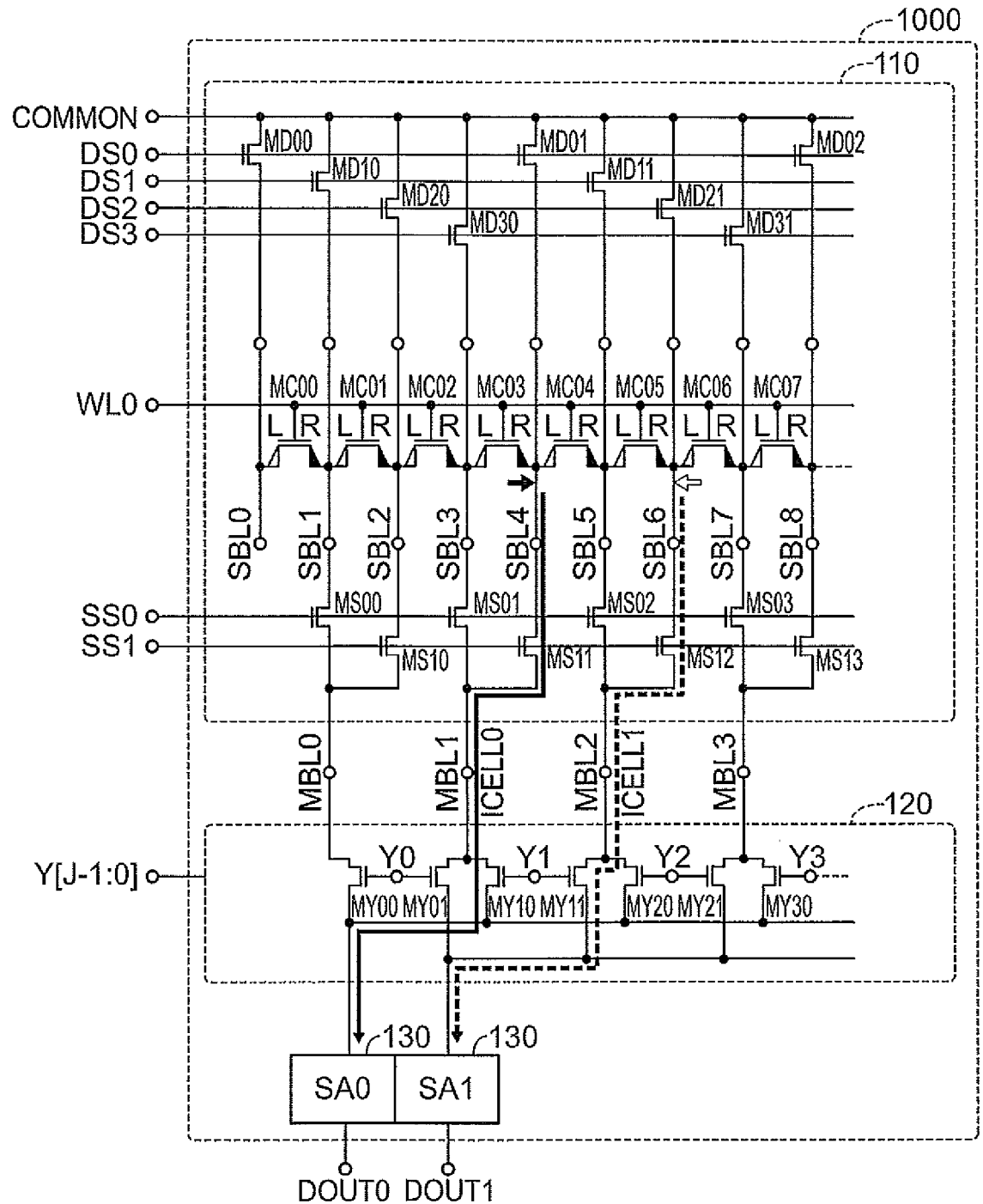
FIG. 24 is a diagram showing an operation of the conventional semiconductor storage circuit.

FIG. 19 and FIG. 20 show a data read operation of the memory cell array 510. However, FIG. 19 and FIG. 20 show only one word line WL0 of N word lines. In this case, only the selected signal lines are shown as DS and SS. The sub-bit lines and the main bit lines are shown until SBL [8:0] and MBL [1:0], respectively. The operation of the memory cell array 510 will be described using FIG. 19 and FIG. 20.

Referring to FIG. 19, the case where MC00_R and MC05_L are selected will be described. In this case, the memory cell array 510 replaces the memory cell array 110 according to the first to fourth exemplary embodiments.

By selecting WL0 by the memory cell array 510, all of the memory cells including MC00 and MC05 that connect WL0 to a gate terminal enter in a conductive state. By selecting DS0, MD00 enters in a conductive state. Then, by selecting DS6, MD60 enters in a conductive state. Then, COMMON is connected to diffusion layers of the MC00_L side and the MC05_R side through SBL0 and SBL6.

By selecting SS0, MS00 and MS01 enter in a conductive state. Then, MBL0 and MBL1 are connected to the diffusion layers of the MC00_R side and the MC05_L side through SBL1 and SBL5. When the path from the main bit line to the sense amplifier is selected, MBL0 and MBL1 are connected to the sense amplifier SA0 and the sense amplifier SA1, as the first to fourth exemplary embodiments.

Thereby, MC00_R and MC05_L are selected, and currents ICELL0 and ICELL1 flow into the sense amplifier SA0 and the sense amplifier SA1, respectively. The sense amplifier SA0 and the sense amplifier SA1 output logical levels, which are determined on the basis of the currents ICELL0 and ICELL1, to DOUT0 and DOUT1, respectively.

Referring to FIG. 20, a case where MC01_R and MC06_L are selected will be described. In this case, the memory cell array 510 replaces the memory cell array 110 according to the first to fourth exemplary embodiments.

By selecting WL0 by the memory cell array 510, all of the memory cells including MC01 and MC06 in which a gate terminal is connect to WL0 enter in a conductive state. By selecting DS1, MD10 enters in a conductive state. Then, by selecting DS7, MD70 enters in a conductive state. Then, COMMON is connected to diffusion layers of the MC01_L side and the MC06_R side through SBL1 and SBL7.

By selecting SS1, MS10 and MS11 enter in a conductive state. Then, MBL0 and MBL1 are connected to the diffusion layers of the MC01_R side and the MC06_L side through SBL2 and SBL6. When the path from the main bit line to the sense amplifier is selected, MBL0 and MBL1 are connected to the sense amplifier SA1 and the sense amplifier SA0, as the first to fourth exemplary embodiments. Thereby, MC01_R and MC06_L are selected, and currents ICELL1 and ICELL0 flow into the sense amplifier SA1 and the sense amplifier SA0, respectively. The sense amplifier SA0 and the sense amplifier SA1 output logical levels, which are determined on the basis of the currents ICELL0 and ICELL1, to DOUT0 and DOUT1, respectively.

The memory cell array 110 that is exemplified in each of the first to fourth exemplary embodiments is configured to interpose the two memory cells between the pair of main bit lines to be adjacent to each other. Meanwhile, the memory cell array 510 is configured to interpose the four memory cells between the pair of main bit lines to be adjacent to each other. Accordingly, the present invention may be applied to the case where the four memory cells are interposed between the pair of main bit lines to be adjacent to each other. Further, the present invention may be applied to the case where memory cells of an arbitrary even number are interposed between a pair of main bit lines to be adjacent to each other. However, when memory cells of an odd number are interposed, the same sensor amplifier may not read and use data of the L side and the R side of the same memory cell. Therefore, the present invention may not be applied.

The semiconductor storage circuits according to the first to fifth exemplary embodiments may be applied to the case where data is read in a non-volatile semiconductor storage circuit configured using multi-bit-type memory cells.

In the semiconductor storage circuits according to the first to fourth exemplary embodiments, the two memory cells are interposed between the pair of main bit lines. In the semiconductor storage circuit according to the fifth exemplary embodiment, the four memory cells are interposed between the pair of main bit lines.

In the first to fifth exemplary embodiments, the drain voltage (1.0 to 2.0 V) of the memory cell is used as the common voltage, and the current flows into the sense amplifier. However, the present invention may be applied to the case where the direction of the current is reversed, and the source voltage (0 V) of the memory cell is used as the common voltage and the current flows out from the sense amplifier.

What is claimed is:

1. A semiconductor storage circuit, comprising:
   a plurality of word lines disposed in a row direction;
   a plurality of sub-bit lines disposed in a column direction, the plurality of sub-bit lines intersecting the plurality of word lines;
   a plurality of main bit lines each provided for a group of adjacent sub-bit lines;
   a plurality of non-volatile memory cells, each provided at an intersecting portion of the word lines and the sub-bit lines and including a control electrode connected to the word line of the intersecting portion, a first electrode connected to the sub-bit line of the intersecting portion, and a second electrode connected to a sub-bit line adjacent to the sub-bit line connected to the first electrode, wherein one bit of information is read from each of the first electrode and the second electrode of the non-volatile memory cell, by changing a direction of a voltage applied between the first and second electrodes when the non-volatile memory cell is selected by the word line;
   a plurality of drain selectors that are provided between one end of the sub-bit lines and a common power supply, and that connects the sub-bit lines, that are connected to a non-selection-side electrode of the first and second electrodes of the two memory cells of read objects, to the common power supply, in a case in which drain selection signals corresponding to two memory cells are supplied;
   a plurality of source selectors, that are provided between the other ends of the sub-bit lines and the main bit lines, and that connects the sub-bit lines, that are connected to the selection-side electrode of the first and second electrodes of the two memory cells, to two adjacent main bit lines, in a case which source selection signals corresponding to the two memory cells are supplied;
   a first sense amplifier that reads data of one of the two memory cells;
   a second sense amplifier that reads data of the other of the two memory cells; and
   a connecting section that connects a main bit line connected to an even-numbered memory cell in a row direction in the two memory cells of the read objects to the first sense amplifier, and that connects a main bit line connected to an odd-numbered memory cell in the row direction in the two memory cells to the second sense amplifier,
   wherein the connecting section includes:
       a first multiplexer that connects the main bit line, which is connected to the second electrode of the even-numbered memory cell in the row direction in the two memory cells, to the first sense amplifier, and that connects the main bit line, which is connected to the first electrode of the odd-numbered memory cell in the row direction in the two memory cells, to the second sense amplifier, and
       a second multiplexer that connects the main bit line, which is connected to the first electrode of the even-numbered memory cell in the row direction in the two memory cells, to the first sense amplifier, and that connects the main bit line, which is connected to the second electrode of the odd-numbered memory cell in the row direction in the two memory cells, to the second sense amplifier.

2. The semiconductor storage circuit of claim 1, wherein an even number of the plurality of memory cells are disposed between adjacent main bit lines.

3. A semiconductor storage circuit, comprising:
   a plurality of word lines disposed in a row direction;
   a plurality of sub-bit lines disposed in a column direction, the plurality of sub-bit lines intersecting the plurality of word lines;
   a plurality of main bit lines each provided for a group of adjacent sub-bit lines;
   a plurality of non-volatile memory cells, each provided at an intersecting portion of the word lines and the sub-bit lines and including a control electrode connected to the word line of the intersecting portion, a first electrode connected to the sub-bit line of the intersecting portion, and a second electrode connected to a sub-bit line adjacent to the sub-bit line connected to the first electrode, wherein one bit of information is read from each of the first electrode and the second electrode of the non-volatile memory cell, by changing a direction of a voltage applied between the first and second electrodes when the non-volatile memory cell is selected by the word line;
   a plurality of drain selectors that are provided between one end of the sub-bit lines and a common power supply, and that connects the sub-bit lines, that are connected to a non-selection-side electrode of the first and second electrodes of the two memory cells of read objects, to the common power supply, in a case in which drain selection signals corresponding to two memory cells are supplied;
   a plurality of source selectors, that are provided between the other ends of the sub-bit lines and the main bit lines, and that connects the sub-bit lines, that are connected to the selection-side electrode of the first and second electrodes of the two memory cells, to two adjacent main bit lines, in a case which source selection signals corresponding to the two memory cells are supplied;

a first sense amplifier that reads data of one of the two memory cells;
a second sense amplifier that reads data of the other of the two memory cells; and
a connecting section that connects a main bit line connected to an even-numbered memory cell in a row direction in the two memory cells of the read objects to the first sense amplifier, and that connects a main bit line connected to an odd-numbered memory cell in the row direction in the two memory cells to the second sense amplifier,
wherein the connecting section includes:
    a multiplexer that connects the main bit line, which is connected to the second electrode of the even-numbered memory cell in the row direction in the two memory cells, to a first data output line, that connects the main bit line, which is connected to the first electrode of the odd-numbered memory cell in the row direction in the two memory cells, to a second data output line adjacent to the first data output line, that connects the main bit line, which is connected to the first electrode of the even-numbered memory cell in the row direction in the two memory cells, to the second data output line, and that connects the main bit line, which is connected to the second electrode of the odd-numbered memory cell in the row direction in the two memory cells, to the first data output line, and
    a sense amplifier selecting circuit that connects the first data output line, which is connected to the second electrode of the even-numbered memory cell in the row direction in the two memory cells, to the first sense amplifier, that connects the second data output line, which is connected to the first electrode of the odd-numbered memory cell in the row direction in the two memory cells, to the second sense amplifier, that connects the second data output line, which is connected to the first electrode of the even-numbered memory cell in the row direction in the two memory cells, to the first sense amplifier, and that connects the first data output line, which is connected to the second electrode of the odd-numbered memory cell in the row direction in the two memory cells, to the second sense amplifier.

4. The semiconductor storage circuit of claim 3, wherein an even number of the plurality of memory cells are disposed between adjacent main bit lines.

5. A semiconductor storage circuit, comprising:
a plurality of word lines disposed in a row direction;
a plurality of sub-bit lines disposed in a column direction, the plurality of sub-bit lines intersecting the plurality of word lines;
a plurality of main bit lines each provided for a group of adjacent sub-bit lines;
a plurality of non-volatile memory cells, each provided at an intersecting portion of the word lines and the sub-bit lines and including a control electrode connected to the word line of the intersecting portion, a first electrode connected to the sub-bit line of the intersecting portion, and a second electrode connected to a sub-bit line adjacent to the sub-bit line connected to the first electrode, wherein one bit of information is read from each of the first electrode and the second electrode of the non-volatile memory cell, by changing a direction of a voltage applied between the first and second electrodes when the non-volatile memory cell is selected by the word line;
a plurality of drain selectors that are provided between one end of the sub-bit lines and a common power supply, and that connects the sub-bit lines, that are connected to a non-selection-side electrode of the first and second electrodes of the two memory cells of read objects, to the common power supply, in a case in which drain selection signals corresponding to two memory cells are supplied;
a plurality of source selectors, that are provided between the other ends of the sub-bit lines and the main bit lines, and that connects the sub-bit lines, that are connected to the selection-side electrode of the first and second electrodes of the two memory cells, to two adjacent main bit lines, in a case which source selection signals corresponding to the two memory cells are supplied;
a first sense amplifier that reads data of one of the two memory cells;
a second sense amplifier that reads data of the other of the two memory cells; and
a connecting section that connects a main bit line connected to an even-numbered memory cell in a row direction in the two memory cells of the read objects to the first sense amplifier, and that connects a main bit line connected to an odd-numbered memory cell in the row direction in the two memory cells to the second sense amplifier,
wherein the connecting section includes:
    a first multiplexer that connects the main bit line, which is connected to the second electrode of the even-numbered memory cell in the row direction in the two memory cells, to a first data output line, that connects the main bit line, which is connected to the first electrode of the odd-numbered memory cell in the row direction in the two memory cells, to a second data output line adjacent to the first data output line, that connects the main bit line, which is connected to the first electrode of the even-numbered memory cell in the row direction in the two memory cells, to a third data output line, and that connects the main bit line, which is connected to the second electrode of the odd-numbered memory cell in the row direction in the two memory cells, to a fourth data output line adjacent to the third data output line,
    a second multiplexer that connects the first data output line, which is connected to the second electrode of the even-numbered memory cell in the row direction in the two memory cells, to the first sense amplifier, and that connects the second data output line, which is connected to the first electrode of the odd-numbered memory cell in the row direction in the two memory cells, to the second sense amplifier, and
    a third multiplexer that connects the third data output line, which is connected to the first electrode of the even-numbered memory cell in the row direction in the two memory cells, to the first sense amplifier, and that connects the fourth data output line, which is connected to the second electrode of the odd-numbered memory cell in the row direction in the two memory cells, to the second sense amplifier.

6. A semiconductor storage circuit, comprising:
a plurality of word lines disposed in a row direction;
a plurality of sub-bit lines disposed in a column direction, the plurality of sub-bit lines intersecting the plurality of word lines;
a plurality of main bit lines each provided for a group of adjacent sub-bit lines;
a plurality of non-volatile memory cells, each provided at an intersecting portion of the word lines and the sub-bit lines and including a control electrode connected to the word line of the intersecting portion, a first electrode connected to the sub-bit line of the intersecting portion, and a second electrode connected to a sub-bit line adjacent to the sub-bit line connected to the first electrode, wherein one bit of information is read from each of the first electrode and the second electrode of the non-volatile memory cell, by changing a direction of a voltage applied between the first and second electrodes when the non-volatile memory cell is selected by the word line;

a plurality of drain selectors that are provided between one end of the sub-bit lines and a common power supply, and that connects the sub-bit lines, that are connected to a non-selection-side electrode of the first and second electrodes of the two memory cells of read objects, to the common power supply, in a case in which drain selection signals corresponding to two memory cells are supplied;

a plurality of source selectors, that are provided between the other ends of the sub-bit lines and the main bit lines, and that connects the sub-bit lines, that are connected to the selection-side electrode of the first and second electrodes of the two memory cells, to two adjacent main bit lines, in a case which source selection signals corresponding to the two memory cells are supplied;

a first sense amplifier that reads data of one of the two memory cells;

a second sense amplifier that reads data of the other of the two memory cells; and a connecting section that connects a main bit line connected to an even-numbered memory cell in a row direction in the two memory cells of the read objects to the first sense amplifier, and that connects a main bit line connected to an odd-numbered memory cell in the row direction in the two memory cells to the second sense amplifier, wherein the connecting section includes:

a first multiplexer that connects the main bit line, which is connected to the second electrode of the even-numbered memory cell in the row direction in the two memory cells, to a first data output line, that connects the main bit line, which is connected to the first electrode of the odd-numbered memory cell in the row direction in the two memory cells, to a second data output line adjacent to the first data output line, that connects the main bit line, which is connected to the first electrode of the even-numbered memory cell in the row direction in the two memory cells, to a third data output line, and that connects the main bit line, which is connected to the second electrode of the odd-numbered memory cell in the row direction in the two memory cells, to a fourth data output line adjacent to the third data output line, a second multiplexer that connects the first data output line, which is connected to the second electrode of the even-numbered memory cell in the row direction in the two memory cells, to a fifth data output line, that connects the second data output line, which is connected to the first electrode of the odd-numbered memory cell in the row direction in the two memory cells, to a sixth data output line adjacent to the fifth data output line, that connects the third data output line, which is connected to the first electrode of the even-numbered memory cell in the row direction in the two memory cells, to the sixth data output line, and that connects the fourth data output line, which is connected to the second electrode of the odd-numbered memory cell in the row direction in the two memory cells, to the fifth data output line, and a sense amplifier selecting circuit that connects the fifth data output line, which is connected to the second electrode of the even-numbered memory cell in the row direction in the two memory cells, to the first sense amplifier, that connects the sixth data output line, which is connected to the first electrode of the odd-numbered memory cell in the row direction in the two memory cells, to the second sense amplifier, that connects the sixth data output line, which is connected to the first electrode of the even-numbered memory cell in the row direction in the two memory cells, to the first sense amplifier, and that connects the fifth data output line, which is connected to the second electrode of the odd-numbered memory cell in the row direction in the two memory cells, to the second sense amplifier.

7. The semiconductor storage circuit of claim 6, wherein an even number of the plurality of memory cells are disposed between adjacent main bit lines.

8. The semiconductor storage circuit of claim 5, wherein an even number of the plurality of memory cells are disposed between adjacent main bit lines.

* * * * *